(12) United States Patent
Lin et al.

(10) Patent No.: US 10,061,691 B2
(45) Date of Patent: Aug. 28, 2018

(54) WRITE DATA OPTIMIZATION METHODS FOR NON-VOLATILE SEMICONDUCTOR MEMORY DEVICES

(71) Applicant: Toshiba Memory Corporation, Minato-ku (JP)

(72) Inventors: Kejen Lin, Yokohama (JP); Tokumasa Hara, Kawasaki (JP); Hironori Uchikawa, Fujisawa (JP); Juan Shi, Yokohama (JP); Akira Yamaga, Kawasaki (JP); Sho Kodama, Kawasaki (JP); Keiri Nakanishi, Kawasaki (JP)

(73) Assignee: TOSHIBA MEMORY CORPORATION, Minato-ku (JP)

( * ) Notice: Subject to any disclaimer, the term of this patent is extended or adjusted under 35 U.S.C. 154(b) by 0 days.

(21) Appl. No.: 15/459,375

(22) Filed: Mar. 15, 2017

(65) Prior Publication Data

US 2018/0068719 A1 Mar. 8, 2018

Related U.S. Application Data

(60) Provisional application No. 62/384,868, filed on Sep. 8, 2016.

(51) Int. Cl.
*G06F 12/00* (2006.01)
*G11C 11/56* (2006.01)
*G11C 16/34* (2006.01)
*G11C 16/04* (2006.01)

(52) U.S. Cl.
CPC .............. *G06F 12/00* (2013.01); *G11C 11/56* (2013.01); *G11C 11/5628* (2013.01); *G11C 11/5642* (2013.01); *G11C 16/0483* (2013.01); *G11C 16/349* (2013.01); *G11C 16/3459* (2013.01)

(58) Field of Classification Search
CPC ............ G11C 11/5628; G11C 16/0483; G11C 16/3459; G11C 11/5642; G11C 16/349
See application file for complete search history.

(56) References Cited

U.S. PATENT DOCUMENTS

| 5,621,682 | A | 4/1997 | Tanzawa et al. | |
|---|---|---|---|---|
| 8,972,826 | B2* | 3/2015 | Lu | G06F 11/1048 714/774 |
| 2005/0078513 | A1 | 4/2005 | Tatsukawa et al. | |
| 2010/0088464 | A1* | 4/2010 | Yang | G06F 12/0246 711/103 |
| 2011/0205805 | A1 | 8/2011 | Honma et al. | |
| 2015/0332758 | A1* | 11/2015 | Yoshihashi | G11C 11/5628 365/185.03 |
| 2017/0091018 | A1* | 3/2017 | Shu | G06F 11/0727 |

OTHER PUBLICATIONS

Shuhei Tanakamaru et al., "Hybrid Storage of ReRAM/TLC NAND Flash with RAID-5/6 for Cloud Data Centers," IEEE International Sold-State Circuits Conference (ISSCC), 978-1-4799-0920-9, Feb. 2014, pp. 3.

* cited by examiner

*Primary Examiner* — Ajay Ojha
(74) *Attorney, Agent, or Firm* — Oblon, McClelland, Maier & Neustadt, L.L.P.

(57) ABSTRACT

According to one embodiment, a controller writes first processed data acquired by a first process into a nonvolatile memory during a first period. The controller writes second processed data acquired by a second process into the non-volatile memory during a second period. The first process is for the purpose of improving the endurance of memory cells. The second process is for the purpose of decreasing inter-cell interferences between adjacent cells.

20 Claims, 29 Drawing Sheets

FIG.9

Padding Pattern #0

| PAGE  | DATA |    |    |    |    |    |    |    |    |
|-------|------|----|----|----|----|----|----|----|----|
| Upper | "0"  | U0 | U1 | U2 | U3 | U4 | U5 | U6 | U7 |
| Lower | "0"  | L0 | L1 | L2 | L3 | L4 | L5 | L6 | L7 |

Padding Pattern #1

| Upper | "0" | U0  | U1 | U2 | U3 | U4 | U5 | U6 | U7 |
| ----- | --- | --- | -- | -- | -- | -- | -- | -- | -- |
| Lower | L0  | "0" | L1 | L2 | L3 | L4 | L5 | L6 | L7 |

⋮

Padding Pattern #K-2

| Upper | U0 | U1 | U2 | U3 | U4 | U5 | U6 | "1" | U7 |
|-------|----|----|----|----|----|----|----|-----|----|
| Lower | L0 | L1 | L2 | L3 | L4 | L5 | L6 | L7  | "1"|

Padding Pattern #K-1

| Upper | U0 | U1 | U2 | U3 | U4 | U5 | U6 | U7 | "1" |
|-------|----|----|----|----|----|----|----|----|-----|
| Lower | L0 | L1 | L2 | L3 | L4 | L5 | L6 | L7 | "1" |

FIG.14

Padding Pattern #0

| PAGE | DATA | | | | | | | |
|---|---|---|---|---|---|---|---|---|
| Upper | U0 | "0" | U1 | U2 | U3 | U4 | U5 | U6 | U7 |
| Lower | L0 | L1 | L2 | "1" | L3 | L4 | L5 | L6 | L7 |

Padding Pattern #1

| PAGE | DATA | | | | | | | |
|---|---|---|---|---|---|---|---|---|
| Upper | U0 | U1 | "1" | U2 | U3 | U4 | U5 | U6 | U7 |
| Lower | L0 | L1 | L2 | L3 | "0" | L4 | L5 | L6 | L7 |

⋮

Padding Pattern #L-2

| PAGE | DATA | | | | | | | |
|---|---|---|---|---|---|---|---|---|
| Upper | U0 | U1 | U2 | U3 | U4 | "0" | U5 | U6 | U7 |
| Lower | L0 | L1 | L2 | L3 | L4 | L5 | L6 | "0" | L7 |

Padding Pattern #L-1

| PAGE | DATA | | | | | | | |
|---|---|---|---|---|---|---|---|---|
| Upper | U0 | U1 | U2 | U3 | U4 | "1" | U5 | U6 | U7 |
| Lower | L0 | L1 | L2 | L3 | L4 | L5 | L6 | L7 | "0" |

SELECTED VIRTUAL DATA

| Upper | U0 | U1 | "1" | U2 | U3 | U4 | U5 | U6 | U7 |
|---|---|---|---|---|---|---|---|---|---|
| Lower | L0 | L1 | L2 | L3 | "0" | L4 | L5 | L6 | L7 |

PADDING DATA INVERSION

| Upper | U0 | U1 | "1" | U2 | U3 | U4 | U5 | U6 | U7 |
|---|---|---|---|---|---|---|---|---|---|
| Lower | L0 | L1 | L2 | L3 | "1" | L4 | L5 | L6 | L7 |

FIG.19A

WITHOUT FLIPPING

| DISTRIBUTION / Page | Er | A | B | C | FLAG |
|---|---|---|---|---|---|
| Upper | 1 | 0 | 0 | 1 | 0 |
| Lower | 1 | 1 | 0 | 0 | 0 |

FIG.19B

FLIP Lower Page DATA

| | | | | | |
|---|---|---|---|---|---|
| Upper | 1 | 0 | 0 | 1 | 0 |
| Lower | 0 | 0 | 1 | 1 | 1 |

FIG.19C

FLIP Upper Page DATA

| | | | | | |
|---|---|---|---|---|---|
| Upper | 0 | 1 | 1 | 0 | 1 |
| Lower | 1 | 1 | 0 | 0 | 0 |

FIG.19D

FLIP Lower Page AND Upper Page DATA

| | | | | | |
|---|---|---|---|---|---|
| Upper | 0 | 1 | 1 | 0 | 1 |
| Lower | 0 | 0 | 1 | 1 | 1 |

FIG.20

DATA TRANSLATION (XOR OPERATION)

| FIXED BIT PATTERN | BEFORE TRANSLATION | AFTER TRANSLATION |
|---|---|---|
| 0 | 0 | 0 |
| 1 | 0 | 1 |
| 0 | 1 | 1 |
| 1 | 1 | 0 |

FIG.21A

WITHOUT DATA TRANSLATION

| Page | DATA PATTERN | | | | | | | | FLAG |
|---|---|---|---|---|---|---|---|---|---|
| Upper | 1 | 1 | 0 | 1 | 0 | 1 | 1 | 0 | 0 |
| Lower | 1 | 0 | 1 | 0 | 0 | 1 | 0 | 1 | 0 |

FIG.21B

TRANSLATE Lower Page DATA

| Upper | 1 | 1 | 0 | 1 | 0 | 1 | 1 | 0 | 0 |
|---|---|---|---|---|---|---|---|---|---|
| Lower | 0 | 0 | 1 | 1 | 1 | 0 | 0 | 1 | 1 |

FIG.21C

TRANSLATE Upper Page DATA

| Upper | 0 | 1 | 0 | 0 | 1 | 0 | 1 | 0 | 1 |
|---|---|---|---|---|---|---|---|---|---|
| Lower | 1 | 0 | 1 | 0 | 0 | 1 | 0 | 1 | 0 |

FIG.21D

TRANSLATE Lower Page AND Upper Page DATA

| Upper | 0 | 1 | 0 | 0 | 1 | 0 | 1 | 0 | 1 |
|---|---|---|---|---|---|---|---|---|---|
| Lower | 0 | 0 | 1 | 1 | 1 | 0 | 0 | 1 | 1 |

FIG.21E

FIXED BIT PATTERN

| 1 | 0 | 0 | 1 | 1 | 1 | 0 | 0 |
|---|---|---|---|---|---|---|---|

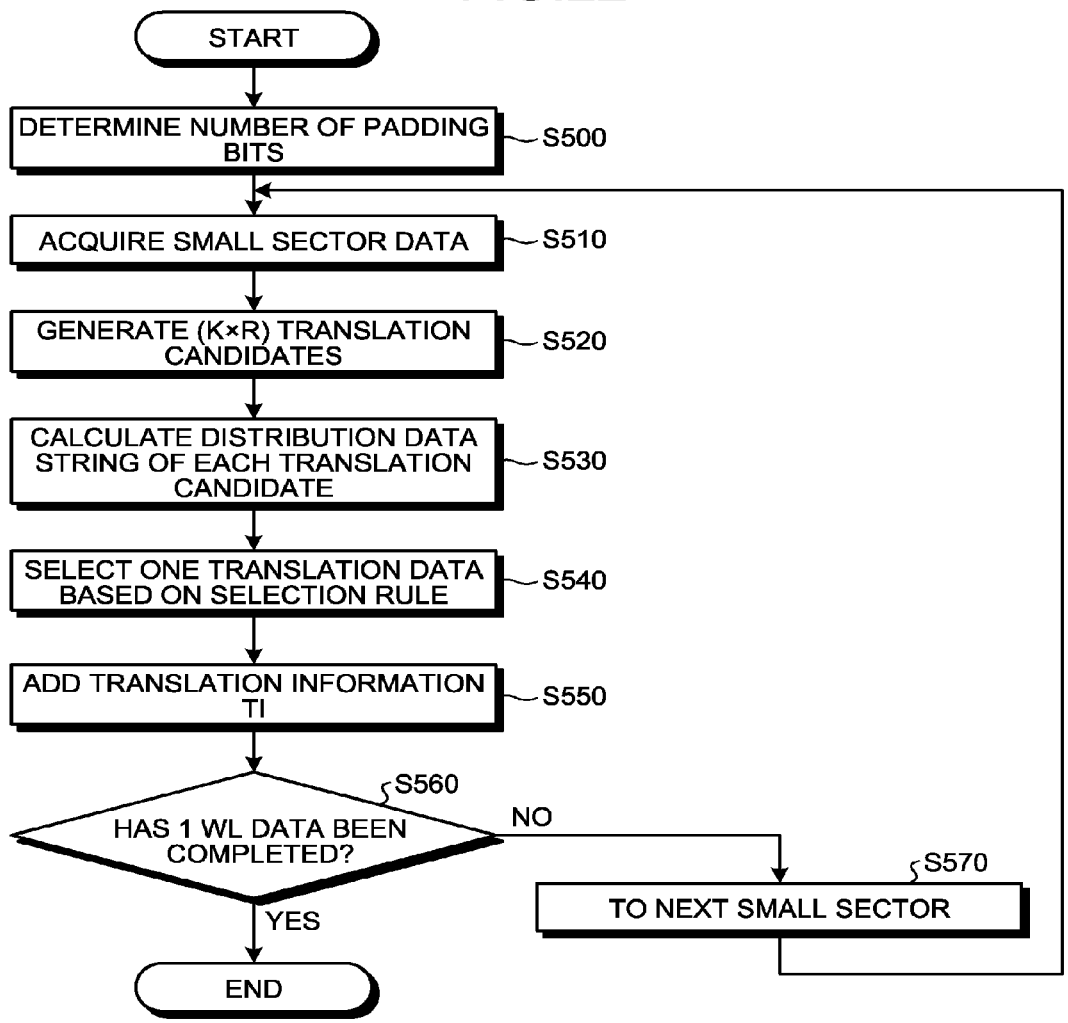

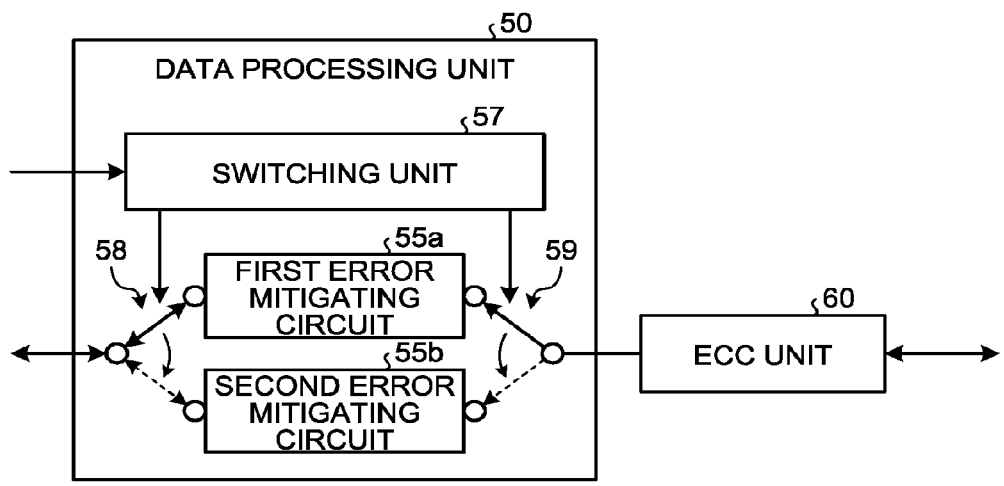

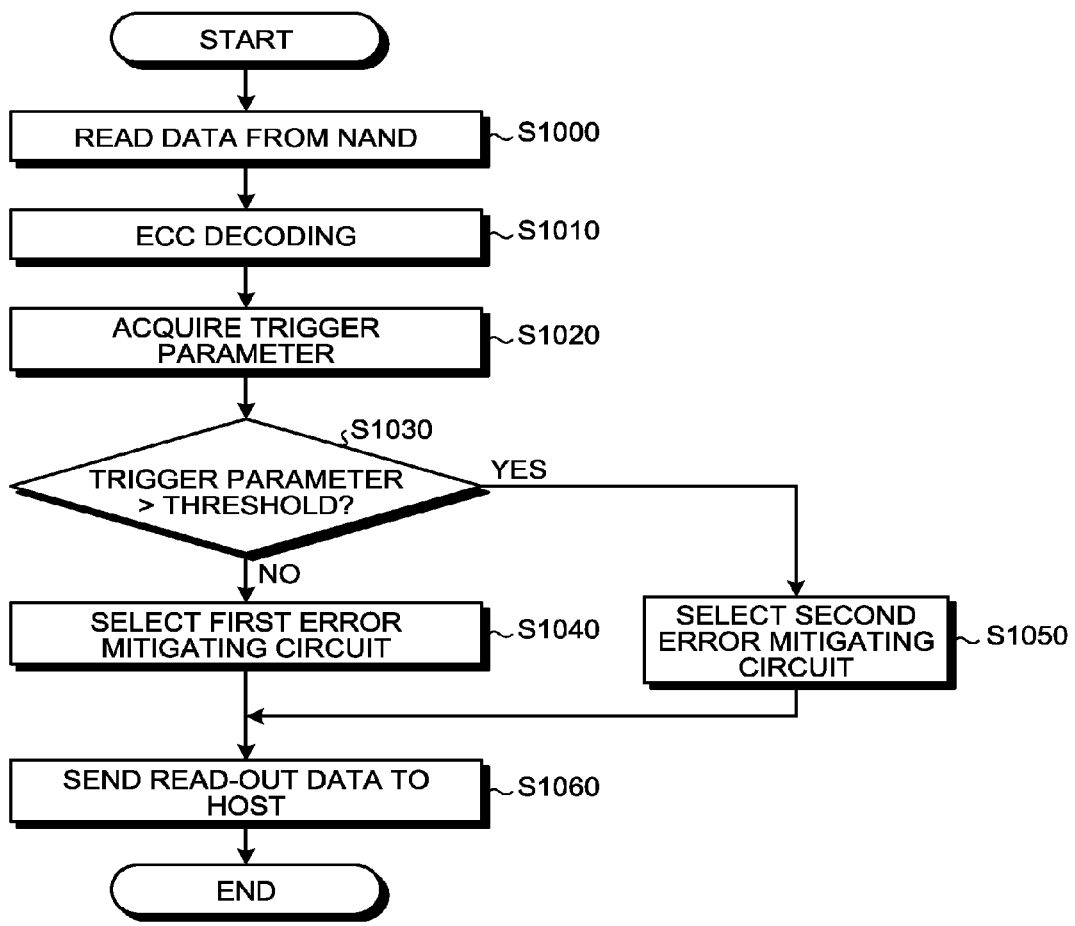

WRITE DATA OPTIMIZATION METHODS FOR NON-VOLATILE SEMICONDUCTOR MEMORY DEVICES

CROSS-REFERENCE TO RELATED APPLICATIONS

This application is based upon and claims the benefit of priority from U.S. Provisional Application No. 62/384,868, filed on Sep. 8, 2016; the entire contents of which are incorporated herein by reference.

FIELD

Embodiments described herein relate generally to a memory system including a nonvolatile memory.

BACKGROUND

In flash memories, in order to raise the frequency of appearance of a memory cell of which a threshold voltage distribution after writing is an erased state, the frequency of appearance of "1" between "1" and "0" included in a write data string is increased.

BRIEF DESCRIPTION OF THE DRAWINGS

FIG. 9 is a diagram that illustrates a padding process according to a first embodiment;

FIG. 14 is a diagram that describes a padding process according to a second embodiment;

FIGS. 19A to 19D are diagrams that describe data coding corresponding to four flipping processes;

FIG. 20 is a diagram that describes data translation based on an exclusive OR operation;

FIGS. 21A to 21D are diagrams that illustrate examples of four exclusive OR operations, and FIG. 21E is a diagram that illustrates an example of a bit pattern;

FIG. 22 is a flowchart that illustrates an example of a data translation (coding) process according to a fourth embodiment;

FIG. 29 illustrates four translation candidates acquired by an error mitigating code process and one translation candidate selected according to a second selection rule applied to a late stage;

FIG. 30 is a block diagram that illustrates another example of the internal configuration of a data processing unit applied to the seventh embodiment;

FIG. 33 is a flowchart that illustrates an example of an inverse data translation (decoding) process performed by the data processing unit illustrated in FIG. 32.

DETAILED DESCRIPTION

In general, according to one embodiment, a memory system includes a nonvolatile memory and a controller. The nonvolatile memory includes a plurality of physical sectors. Each of the physical sectors includes a plurality of memory cells. Each of the memory cells is capable of storing data of N bits using threshold voltage distributions of the N-th power of two. Each of the physical sectors stores data of N pages. N is a natural number of one or more. The controller is configured to write, into a first physical sector, first processed data acquired by a first process during a first period, and write, into the first physical sector, second processed data acquired by a second process during a second period. The second period is a period after the first period. The first process includes translating first data to the first processed data based on a number of first value or a number of second value. The first value corresponds to a highest threshold voltage distribution among threshold voltage distributions of the N-th power of two. The second value corresponds to a lowest threshold voltage distribution among threshold voltage distributions of the N-th power of two. The second process includes translating the first data to the second processed data based on an arrangement of the first value and second value.

Exemplary embodiments of memory systems will be described below in detail with reference to the accompanying drawings. The present invention is not limited to the following embodiments.

(First Embodiment)

Figure 1:
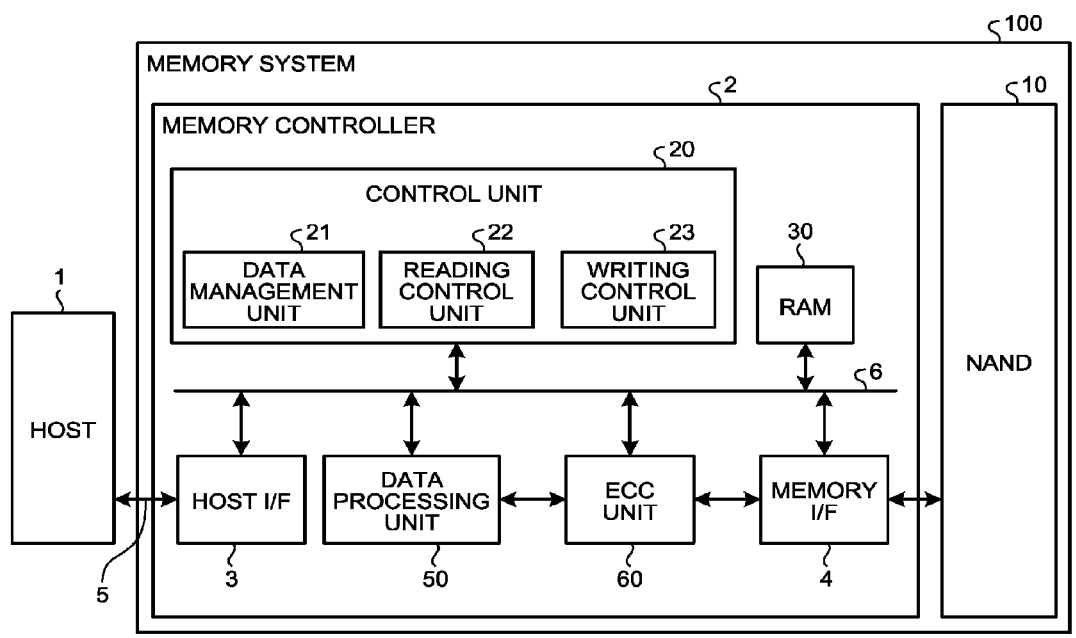
FIG. 1 is a functional block diagram that illustrates the internal configuration of a memory system according to an embodiment.

FIG. 1 is a block diagram that illustrates an example of the configuration of a memory system 100 according to a first embodiment. The memory system 100 is connected to a host apparatus (hereinafter, abbreviated as a host) through a communication line 5 and functions as an external storage device of the host 1. The host 1, for example, may be an information processing apparatus such as a personal computer, a mobile phone, or an imaging apparatus, may be a mobile terminal such as a tablet computer or a smart phone, a gaming device, or an in-vehicle terminal such as a car navigation system.

The memory system 100 includes: a NAND flash memory (hereinafter, abbreviated as a NAND) 10 as a nonvolatile memory; and a memory controller 2. The nonvolatile memory is not limited to the NAND flash memory but may be a flash memory having a three-dimensional structure, a resistance random access memory (ReRAM), a ferroelectric random access memory (FeRAM), a hard disk drive (HDD), or the like.

The NAND 10 includes one or more memory chips each including a memory cell array. The memory cell array includes a plurality of memory cells arranged in a matrix pattern. The memory cell array includes a plurality of blocks that are units for data erasing. Each block is configured by a plurality of physical sectors MS (see FIG. 2). The memory cell array that is a premise of this embodiment is not particularly limited to a specific configuration but may be a memory cell array having a two-dimensional structure as illustrated in FIG. 2, a memory cell array having a three-dimensional structure, or a memory cell array having any other structure.

Figure 2:
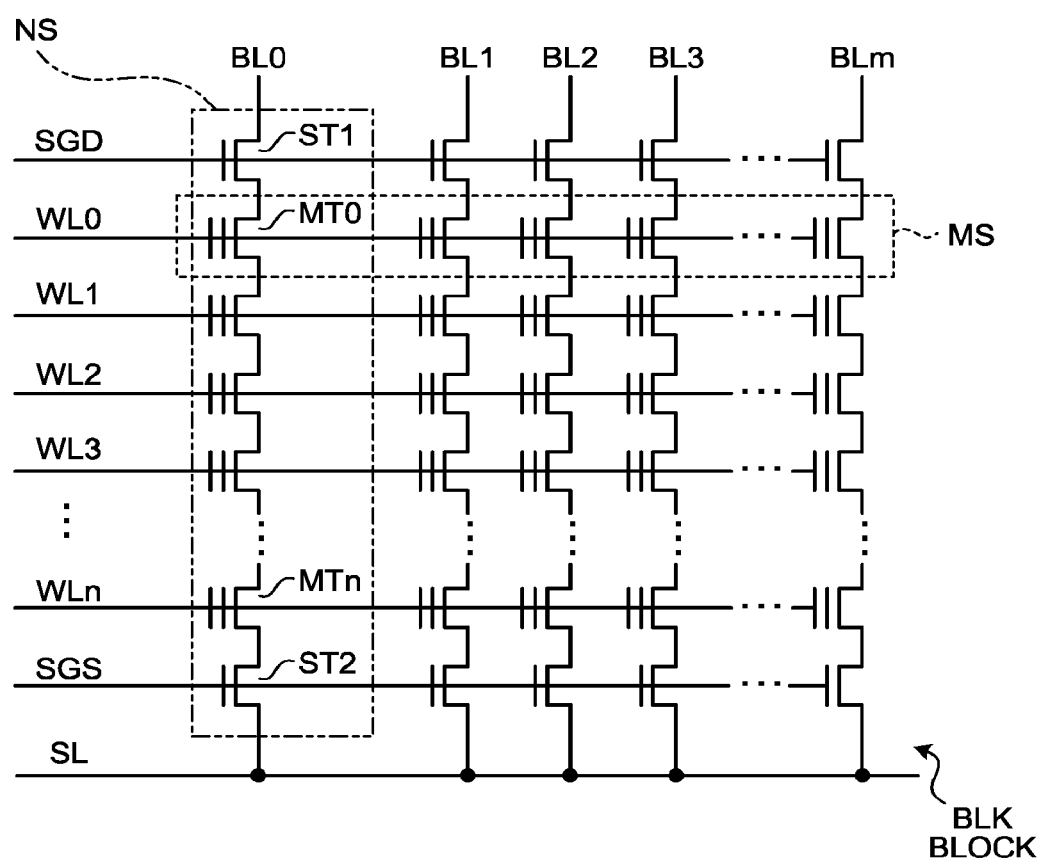
FIG. 2 is a diagram that illustrates an example of the configuration of a block of a memory cell array having a two-dimensional structure.

FIG. 2 is a diagram that illustrates an example of the configuration of a block of the memory cell array having a two-dimensional structure. FIG. 2 illustrates one of a plurality of blocks that configure the memory cell array having the two-dimensional structure. The other blocks of the memory cell array have the same configuration as that illustrated in FIG. 2. As illustrated in FIG. 2, the block BLK of the memory cell array includes (m+1) (here, m is an integer of "0" or more) NAND strings NS. Each NAND string NS includes: (n+1) (here, n is an integer of zero or more) memory cell transistors MT0 to MTn connected in series to share a diffusion area (a source region or a drain region) between memory cell transistors MT adjacent to each other; and selection transistors ST1 and ST2 arranged at both ends of the column of the (n+1) memory cell transistors MT0 to MTn.

Word lines WL0 to WLn are respectively connected to control gate electrodes of the memory cell transistors MT0 to MTn that configure the NAND string NS, and, memory cell transistors MTi (here, i=0 to n) included in each NAND string NS are connected to be common using the same word line WLi (here, i=0 to n). In other words, the control gate electrodes of the memory cell transistors MTi disposed in the same row within the block BLK are connected to the same word line WLi.

Each of the memory cell transistors MT0 to MTn is configured by a field effect transistor having a stacked gate structure on a semiconductor substrate. Here, the stacked gate structure includes: a charge storage layer (floating gate electrode) formed on the semiconductor substrate with a gate insulating film being interposed therebetween; and a control gate electrode formed on the charge storage layer with an inter-gate insulating film being interposed therebetween. A threshold voltage of each of the memory cell transistors MT0 to MTn changes according to the number of electrons storable in the floating gate electrode and thus, can store data according to a difference in the threshold voltage.

Bit lines BL0 to BLm are respectively connected to the drains of (m+1) selection transistors ST1 within one block BLK, and a selection gate line SGD is connected to be common to the gates of the selection transistors. In addition, the source of the selection transistor ST1 is connected to the drain of the memory cell transistor MT0. Similarly, a source line SL is connected to be common to the sources of the (m+1) selection transistors ST2 within one block BLK, and a selection gate line SGS is connected to be common to the gates of the selection transistors. In addition, the drain of the selection transistor ST2 is connected to the source of the memory cell transistor MTn.

Each memory cell is connected not only to the word line but also to the bit line. Each memory cell can be identified by using an address used for identifying a word line and an address used for identifying a bit line. As described above, the data of memory cells (the memory cell transistors MT) disposed within the same block BLK is erased altogether. On the other hand, data is written and read in units of physical sectors MS. One physical sector MS includes a plurality of memory cells connected to one word line.

Each memory cell can perform multi-value storage. In a case where the memory cells are operated in a single level cell (SLC) mode, one physical sector MS corresponds to one page. On the other hand, in a case where the memory cells are operated in a multiple level cell (MLC) mode, one physical sector MS corresponds to N pages (here, N is a natural number of two or more). In descriptions presented here, the term MLC mode is assumed to include a triple level cell (TLC) mode of N=3 and a quadruple level cell (QLC) mode of N=4.

In a read operation and a program operation, one-word line is selected according to the physical address, and one physical sector MS is selected. A switching of the page within this physical sector MS is performed using the physical address.

Figure 3:
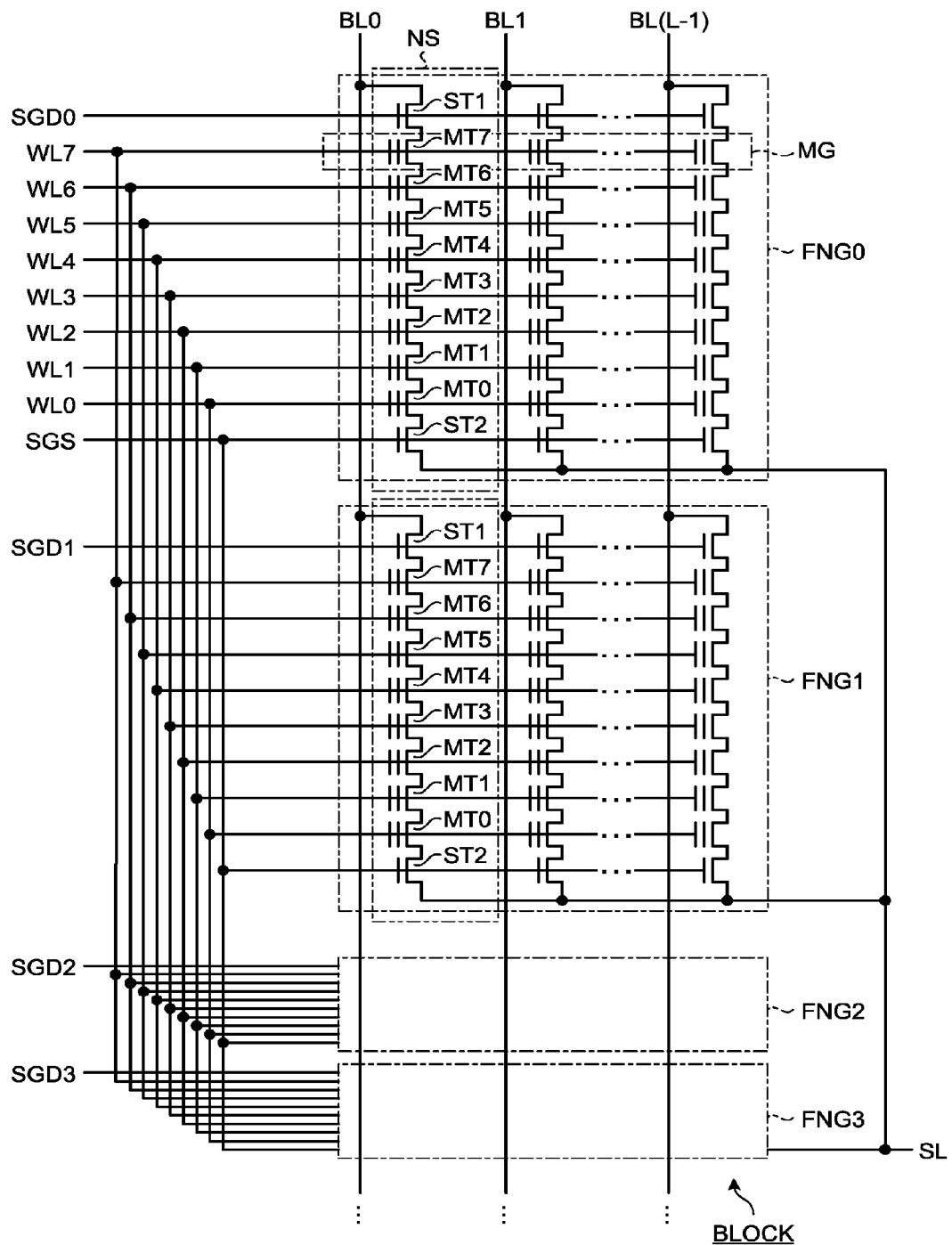
FIG. 3 is a diagram that illustrates an example of the configuration of a block of a memory cell array having a three-dimensional structure.

FIG. 3 is a diagram that illustrates an example of the configuration of a block of a memory cell array having a three-dimensional structure. FIG. 3 illustrates one block BLK0 among a plurality of blocks configuring the memory cell array having the three-dimensional structure. Another block of the memory cell array has a configuration similar to that illustrated in FIG. 3.

As illustrated in the figure, the block BLK0, for example, includes four fingers FNG (FNG0 to FNG3). In addition, each finger FNG includes a plurality of NAND strings NS. Each NAND string NS, for example, includes eight memory cell transistors MT (MT0 to MT7) and selection transistors ST1 and ST2. Here, the number of memory cell transistors MT is not limited to eight. The memory cell transistor MT is arranged between the selection transistors ST1 and ST2 such that the current paths thereof are connected in series. The current path of the memory cell transistor MT7 disposed on one end side of the series connection is connected to one end of the current path of the selection transistor ST1, and the current path of the memory cell transistor MT0 disposed on the other end side is connected to one end of the current path of the selection transistor ST2.

The gates of the selection transistors ST1 of the fingers FNG0 to FNG3 are commonly connected respectively to selection gate lines SGD0 to SGD3. On the other hand, the gates of the selection transistors ST2 are commonly connected to the same selection gate line SGS among a plurality of fingers FNG. In addition, the control gates of the memory cell transistors MT0 to MT7 disposed inside a same block BLK0 are commonly connected to word lines WL0 to WL7. In other words, while the word lines WL0 to WL7 and the selection gate lines SGS are commonly connected among the plurality of fingers FNG0 to FNG3 disposed inside a same block BLK, the selection gate line SGD is independent for each of the fingers FNG0 to FNG3 also inside the same block BLK.

The word lines WL0 to WL7 are connected to the control gate electrodes of the memory cell transistors MT0 to MT7 configuring the NAND string NS, and the memory cell transistors MTi (i=0 to n) of each NAND string NS are commonly connected by a same word line WLi (i=0 to n). In other words, the control gate electrodes of the memory cell transistors MTi disposed in the same row disposed inside the block BLK are connected to a same word line WLi.

Each memory cell is connected to a word line and a bit line. Each memory cell can be identified by using an address used for identifying a word line and selection gate lines SGD0 SGD3 and an address used for identifying a bit line. As described above, data of memory cells (memory cell transistors MT) disposed inside a same block BLK is erased together. On the other hand, data reading and data writing are performed in units of physical sectors MS. One physical sector MS is connected to one word line WL and includes a plurality of memory cells belonging to one finger FNG.

When a read operation or a program operation is performed, one-word line WL and one selection gate line SGD are selected according to a physical address, and thus a physical sector MS is selected.

Figure 4:
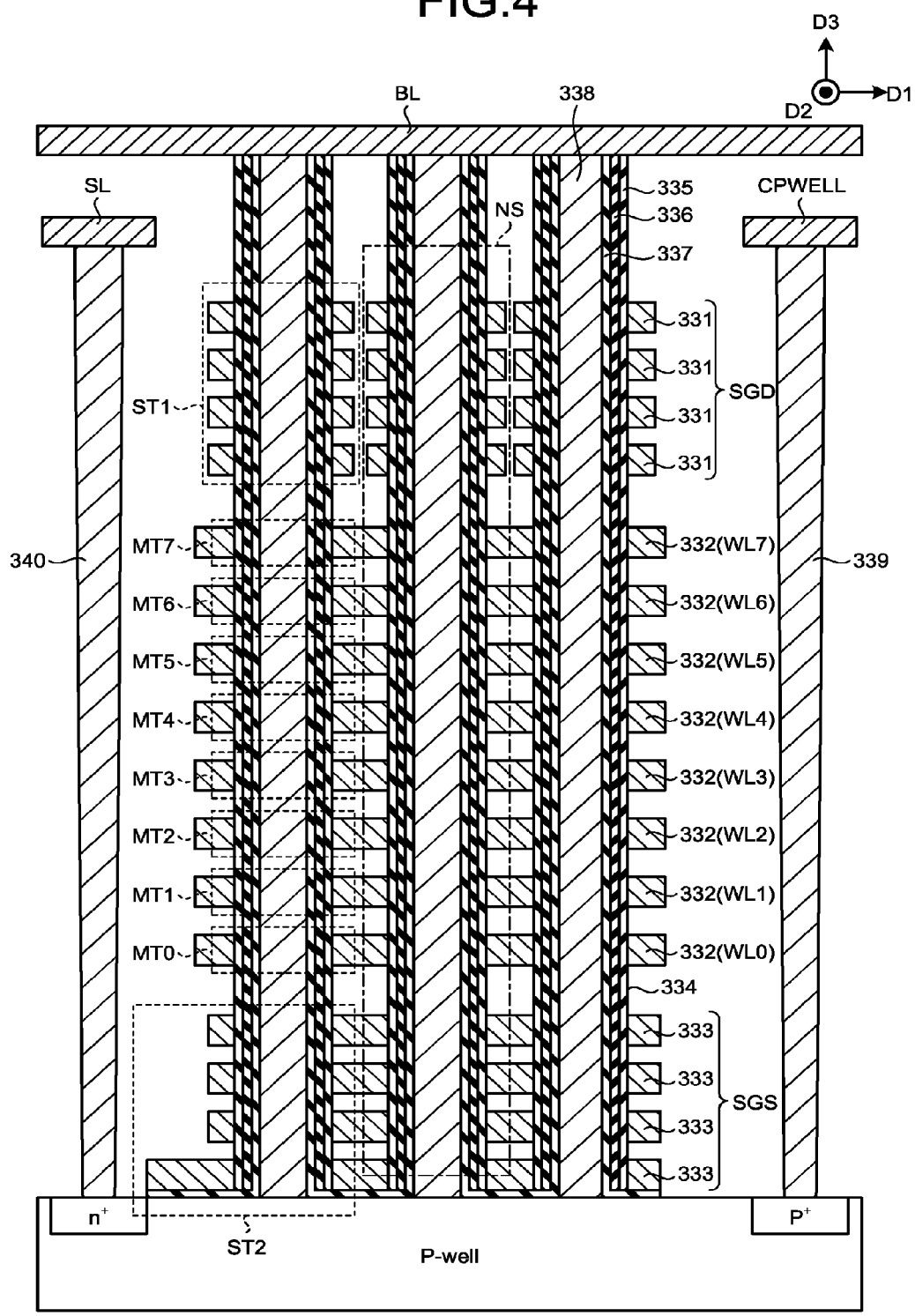
FIG. 4 is a cross-sectional view of a partial area of a memory cell array of a NAND memory having a three-dimensional structure.

FIG. 4 is a cross-sectional view of a partial area of a memory cell array of a NAND memory having a three-dimensional structure. As illustrated in FIG. 4, a plurality of NAND strings NS are formed on a P-well region. In other words, on the P-well region, a plurality of wiring layers 333 functioning as selection gate lines SGS, a plurality of wiring layers 332 functioning as word lines WL, and a plurality of wiring layers 331 functioning as selection gate lines SGD are formed.

A memory hole 334 that arrives at the P-well region through such wiring layers 333, 332, and 331 is formed. On the side face of the memory hole 334, a block insulating film 335, a charge storage layer 336, and a gate insulating film 337 are sequentially formed, and a conductive film 338 is embedded inside the memory hole 334. The conductive film 338 functions as a current path of the NAND string NS and is an area in which a channel is formed when the memory cell transistors MT and the selection transistors ST1 and ST2 operate.

In each NAND string NS, on the P-well region, the selection transistor ST2, a plurality of the memory cell transistors MT, and the selection transistor ST1 are sequentially stacked. At the upper end of the conductive film 338, a wiring layer functioning as a bit line BL is formed.

In addition, inside the front face of the P-well region, an n+ type impurity diffusion layer and a p+ type impurity diffusion layer are formed. On the n+ type impurity diffusion layer, a contact plug 340 is formed, and a wiring layer functioning as a source line SL is formed on the contact plug 340. In addition, on the p+ type impurity diffusion layer, a contact plug 339 is formed, and a wiring layer functioning as a well wiring CPWELL is formed on the contact plug 339.

A plurality of the configurations illustrated in FIG. 4 are arranged in a depth direction of the paper face of FIG. 4, and one finger FNG is formed by a set of a plurality of NAND strings aligned in one line in the depth direction.

In the configuration illustrated in FIG. 1, user data transmitted from the host 1, management information of the memory system 100, firmware (not illustrated in the drawing), and the like are stored in the NAND 10. The firmware operates a CPU (not illustrated in the drawing) that realizes at least a part of the function of the control unit 20 of the memory controller 2. The firmware may be stored in a ROM not illustrated in the drawing. The management information includes a logical/physical translation table and the like.

The memory controller 2 includes: a host interface 3; a memory interface 4; a control unit 20; a RAM 30; a data processing unit 50; and an ECC unit 60. In this embodiment, while the RAM 30 is arranged inside the memory controller 2, the RAM 30 may be disposed outside the memory controller 2. The host I/F 3 performs a process according to the specification of an interface with the host 1 and outputs a command, user data (write data), and the like received from the host 1 to an internal bus 6. In addition, the host I/F 3 transmits user data read from the NAND 10, a response from the control unit 20, and the like to the host 1. The memory I/F 4 directly controls the NAND 10 based on an instruction from the control unit 20.

The RAM 30 is a volatile semiconductor memory that can be accessed at a speed higher than that of the NAND 10. The RAM 30 includes a storage area as a data buffer. Data received from the host 1 is temporarily stored in the RAM 30 before being written into the NAND 10. Data read from the NAND 10 is temporarily stored in the RAM 30 before the transmission thereof to the host 1. The management information stored in the NAND 10 is loaded into the RAM 30. The management information loaded into the RAM 30 is backed up in the NAND 10. The RAM 30 functions also as a buffer in which firmware stored in the NAND 10 is loaded. As the RAM 30, a static random access memory (SRAM) or a dynamic random access memory (DRAM) is used.

The control unit 20 integrally controls each constituent element of the memory system 100. The control unit 20 includes: a data management unit 21; a reading control unit 22; and a writing control unit 23. The function of the control unit 20 is realized by one or a plurality of CPUs (processors) executing the firmware loaded in the RAM 30 and peripheral circuits thereof. The function of the data management unit 21 is realized by the CPU and/or hardware executing the firmware. The function of the reading control unit 22 is realized by the CPU and/or hardware executing the firmware. The function of the writing control unit 23 is realized by the CPU and/or hardware executing the firmware.

The data management unit 21 manages the user data by using the logical/physical translation table that is one of the above-described management information loaded in the RAM 30. Mapping associating a logical address used by the host 1 and a physical address of the RAM 30 or the NAND 10 with each other is registered in the logical/physical translation table. For the logical address, for example, logical block addressing (LBA) is used. The physical address represents a storage position on the RAM 30 or the NAND 10 in which data is stored.

The writing control unit 23 performs a process for writing data into the NAND 10 in accordance with a write command that is notified from the host 1 through the host I/F 3. For example, in a case where a write request is received from the host 1, the writing control unit 23 acquires a physical position on the NAND 10 that is used for writing data from the data management unit 21 and outputs the physical position and a code word output from the ECC unit 60 to the memory I/F 4.

The reading control unit 22 performs a control process for reading data from the NAND 10 in accordance with a read command notified from the host 1 through the host I/F 3. For example, the reading control unit 22 acquires a physical position on the NAND 10 that corresponds to a logical address of read data from the data management unit 21 and notifies the memory I/F 4 of the physical position.

The data processing unit 50 performs a padding process adding padding data to data to be written into the NAND 10. The data processing unit 50 inputs the data for which the padding process has been performed to the ECC unit 60. In addition, the data processing unit 50 inputs data read from the NAND 10 from the ECC unit 60. The data processing unit 50 removes the padding data from the input data. The padding process performed by the data processing unit 50 will be described in detail later. The function of the data processing unit 50 is realized by a CPU and/or hardware executing firmware. A randomizer that randomizes data before being processed by the data processing unit 50 may be included, and data randomized by the randomizer may be input to the data processing unit 50. The data read from the NAND 10 that is inversely data processed by the data processing unit 50 is de-randomized by the randomizer.

The ECC unit 60 performs an error correction coding process for data transmitted from the data processing unit 50, thereby generating a parity. The ECC unit 60 outputs a code word including the data and the parity to the memory I/F 4. The memory I/F 4 inputs a code word read from the NAND 10 to the ECC unit 60. The ECC unit 60 performs an error correction decoding process by using the input code word and inputs decoded data to the data processing unit 50. The function of the ECC unit 60 is realized by a CPU and/or hardware executing firmware.

As a coding system used by the ECC unit 60, any system may be used. For example, reed Solomon (RS) coding, Bose Chaudhuri Hocquenghem (BCH) coding, low density parity check (LDPC) coding, or the like may be used.

In a case where a write request is received from the host 1, the memory system 100 operates as follows. The writing control unit 23 temporarily stores write data into the RAM 30. The writing control unit 23 reads data stored in the RAM 30 and inputs the read data to the data processing unit 50. The data processing unit 50 performs a data translation adding padding data to the input data and inputs the data after the translation and translation information representing the content of the translation to the ECC unit 60. The ECC unit 60 codes the data and the translation information that have been input and inputs a code word to the memory I/F 4. The memory I/F 4 writes the input code word into the NAND 10.

In a case where a read request is received from the host 1, the memory system 100 operates as below. The memory I/F 4 inputs the code word read from the NAND 10 to the ECC unit 60. The ECC unit 60 decodes the input code word and inputs decoded data to the data processing unit 50. The data processing unit 50 performs an inverse translation of the translation made at the time of writing data and removes padding data and translation information from the input data. The data processing unit 50 stores the inversely-translated data in the RAM 30. The reading control unit 22 transmits the data stored in the RAM 30 to the host 1 through the host I/F 3.

Figure 5:
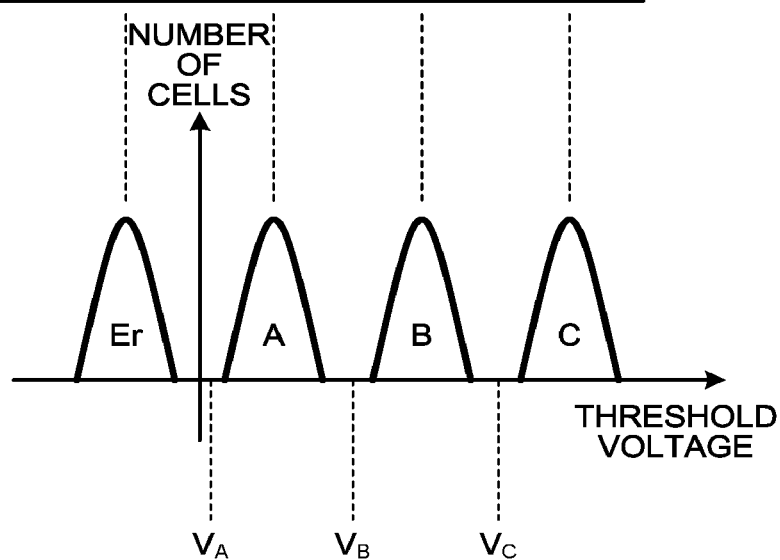
FIG. 5 is a diagram that illustrates an example of a threshold voltage distribution and data coding of memory cells of two bits/cell.

FIG. 5 is a diagram that illustrates an example of a threshold voltage distribution and data coding of memory cells that are two-bit cells. In a lower diagram of FIG. 5, the horizontal axis represents a threshold voltage, and the vertical axis represents the number of memory cells. In the case of memory cells that are two-bit cells, four distributions formed by a distribution Er, a distribution A, a distribution B, and a distribution C are included. The distribution Er has a lowest threshold voltage and corresponds to a threshold voltage distribution of an erased state. The threshold voltage is higher in order of distributions A, B, and C. Thus, the distribution C has a highest threshold voltage. In a case where memory cells that are two-bit cells are used, data values of two bits are associated with the four threshold voltage distributions Er, A, B, and C. Such association is called data coding. The data coding is set in advance, and, at the time of writing (programming) data, electric charge is injected into memory cells such that a threshold voltage distribution corresponding to a data value stored in accordance with data coding is formed. In a case where two-bit cells are used, one physical sector corresponds to two pages. Two bits that can be stored in each memory cell correspond to these two pages. In this embodiment, these two pages will be referred to as a lower page and an upper page.

In FIG. 5, an upper diagram is a diagram that illustrates data coding. As illustrated in the upper diagram in FIG. 5, a distribution Er corresponds to a data value of "11", a distribution A corresponds to a data value of "01", a distribution B corresponds to a data value of "00", and a distribution C corresponds to a data value of "10". In this embodiment, when upper page data is denoted by Du, and lower page data is denoted by Dl, the data value of two bits will be denoted as "DuDl". The data coding illustrated in FIG. 5 is an example, and the data coding is not limited to the example illustrated in FIG. 5. A reading voltage VA is set between the distribution Er and the distribution A, a reading voltage VB is set between the distribution A and the distribution B, and a reading voltage VC is set between the distribution B and the distribution C. Here, VB is a reading voltage used for determining the data value of the lower page, and VA and VC are reading voltages used for determining the data value of the upper page.

In a flash memory, as a transition between a written state (the distributions A, B, and C) and an erased state (the distribution Er) is repeated more, the number of electrons passing through an oxide film of a memory cell increases, and thus the degree of wear becomes higher. In addition, as a writing operation is performed for the distribution C having a higher threshold voltage, interference given to an adjacent memory cell increases, and a probability of causing a read error increases. In order to alleviate such a phenomenon, a process for increasing the frequency of appearance of "1" included in a write data string by padding data is performed. In such a technique, "1" in the case of a single level cell (SLC) or "11" in the case of a multi-level cell (MLC) correspond to a threshold voltage distribution of the erased state, and accordingly, by increasing the frequency of appearance of "1", the frequency of appearance of a memory cell of which the threshold voltage distribution after writing is in the erased state (the distribution Er) is increased.

However, in a case where a position at which data is padded and the data to be padded are fixed regardless of the content of a write data string, there is a possibility that the effect of decreasing a read error according to the padding process is not necessarily effective. The reason for this is that it is difficult for a technique performing padding with the position and the data fixed to respond to the following phenomenon occurring in a case where the micronization of a memory further advances.

Figure 6:
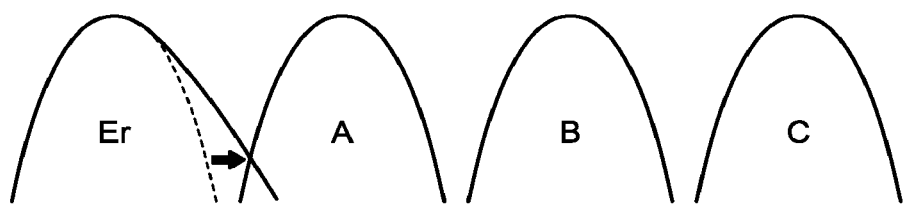
FIG. 6 is a diagram that describes an Er to A phenomenon.

The phenomenon is interference between adjacent cells (inter-cell interference) that occurs due to an increase in a leakage current accompanied with the micronization of cells or a decrease in the increase rate of recording prohibition electric potential in a memory cell channel at the time of writing data. The interference between adjacent cells is a phenomenon in which capacitive coupling occurs between the adjacent cells when there is a big difference between threshold voltages of the adjacent cells, and a threshold voltage of a cell having a lower threshold voltage is increased. In a case where the threshold voltage levels of the adjacent cells are equivalent to maximum-minimum-maximum or minimum-maximum-minimum, the influence thereof is the highest. In the case of two bits/cell, in a case where the distribution is equivalent to the distribution C-the distribution Er-the distribution C (hereinafter, abbreviated as C-Er-C) or the distribution Er-the distribution C-the distribution Er (hereinafter, abbreviated as Er-C-Er), the influence thereof is the highest. According to the interference between the adjacent cells, as illustrated in FIG. 6, the threshold voltage of the memory cell of the distribution Er increases up to the distribution A as the threshold voltage distribution is more adjacent to the distribution Er, and, as a result, there are cases where an erroneous data value is read at the time of reading data. Hereinafter, this phenomenon will be referred to as an Er to A phenomenon.

Figure 7:
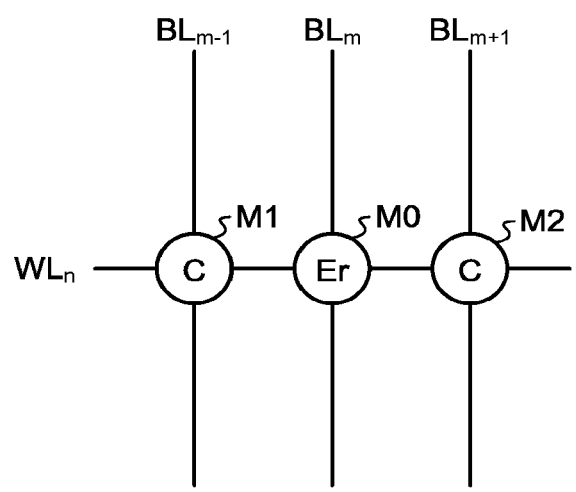
FIG. 7 is a diagram that illustrates the arrangement pattern of threshold voltage distributions of adjacent cells for which the Er to A phenomenon is degraded.

FIG. 7 illustrates an example of the arrangement pattern of a threshold voltage distribution of adjacent cells for which the Er to A phenomenon is degraded the most. The threshold voltage of the memory cell M0 illustrated in FIG. 7 belongs to the lowest distribution Er. The memory cell M0 receives influences from adjacent cells M1 and M2 that are adjacent thereto in the direction of the word line. The threshold voltages of the adjacent cells M1, and M2 belong to the distribution C having a highest threshold voltage, and the memory cell M0 is sandwiched between the adjacent cells M1 and M2 belonging to the distribution C.

Thus, in this embodiment, when a data padding process is performed, a position at which data is padded and padding data are adaptively changed according to an original write data string such that a data pattern satisfying a desired condition such as a decrease in the read error is formed. In this way, according to the data padding process, a data pattern satisfying the desired condition can be efficiently acquired.

Figure 8:
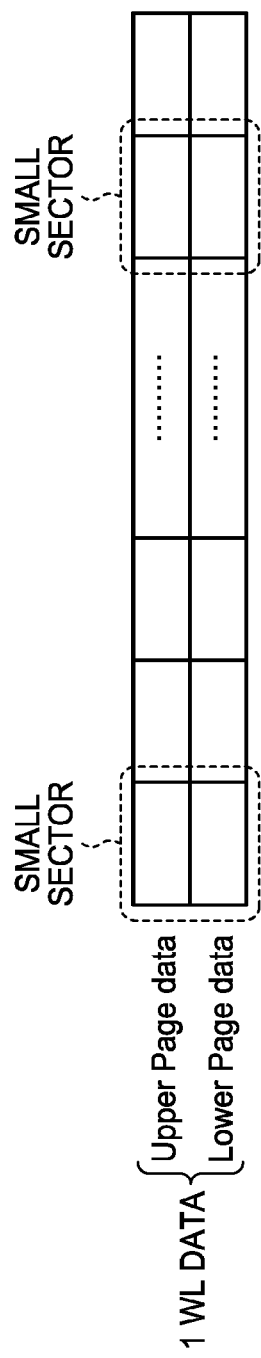
FIG. 8 is a diagram that illustrates a relation between one-word line data and a small sector.

The data processing unit 50 illustrated in FIG. 1 will be described. In the first embodiment, a case where two-bit data is recorded into one memory cell will be described. FIG. 8 is a diagram that illustrates a management unit of a data translation performed by the data processing unit 50. Data of N pages stored in one physical sector MS will be referred to as word line data (hereinafter, abbreviated as WL data). In the case of two bits/cell, 1 WL data includes lower page data and upper page data. The 1 WL data is divided into a plurality of small sectors having a certain data length. In other words, one physical sector MS includes a plurality of small sectors. One small sector includes a plurality of memory cells. Data stored in a small sector will be referred to as small sector data. One small sector data is configured by data having a certain data length among lower page data and data having a certain data length among upper page data. One small sector data is the unit of the padding process performed by the data processing unit 50.

In the first embodiment, a best candidate is selected from among all the data translation candidates having different padding positions and different padding data. The data processing unit 50 performs the padding process for each small sector data. FIG. 9 is a diagram that illustrates the padding process according to the first embodiment and illustrates K padding patterns corresponding to all the data translation candidates. Each data translation candidate includes one small sector data and added padding data. In the case illustrated in FIG. 9, the small sector data is configured by eight bits, and the padding data is configured by one bit. U0 to U7 represent upper page data of eight bits. L0 to L7 represent lower page data of eight bits. "0" represents padding data 0 of one bit. "1" represents padding data 1 of one bit.

In the case illustrated in FIG. 9, since N=two bits/cell, the number of bits of the small sector data p=8, the number of bits of the padding data q=1, the number (the number of all the combinations) K of all the data translation candidates is $(8\times2)^2=256$. Generally, the number K of all the combinations is as in the following Equation (1). In the equation, ^N represents the power of N.

$$K=(pCq\times 2q)^{\wedge}N \quad (1)$$

$$pCq=p!/(q!(p-q)!)$$

As illustrated in FIG. 9, in the case of padding pattern #0, padding data "0" is inserted before the data U0 to U7, and padding data "0" is inserted before the data L0 to L7. In the case of padding pattern #1, padding data "0" is inserted before the data U0 to U7, and padding data "0" is inserted between the data L0 and the data L1. In the case of padding pattern #K−2, padding data "1" is inserted between the data U6 and the data U7, and padding data "1" is inserted after the data L0 to L7. In the case of padding pattern #K−1, padding data "1" is inserted after the data U0 to U7, and padding data "1" is inserted after the data L0 to L7.

Figure 10:
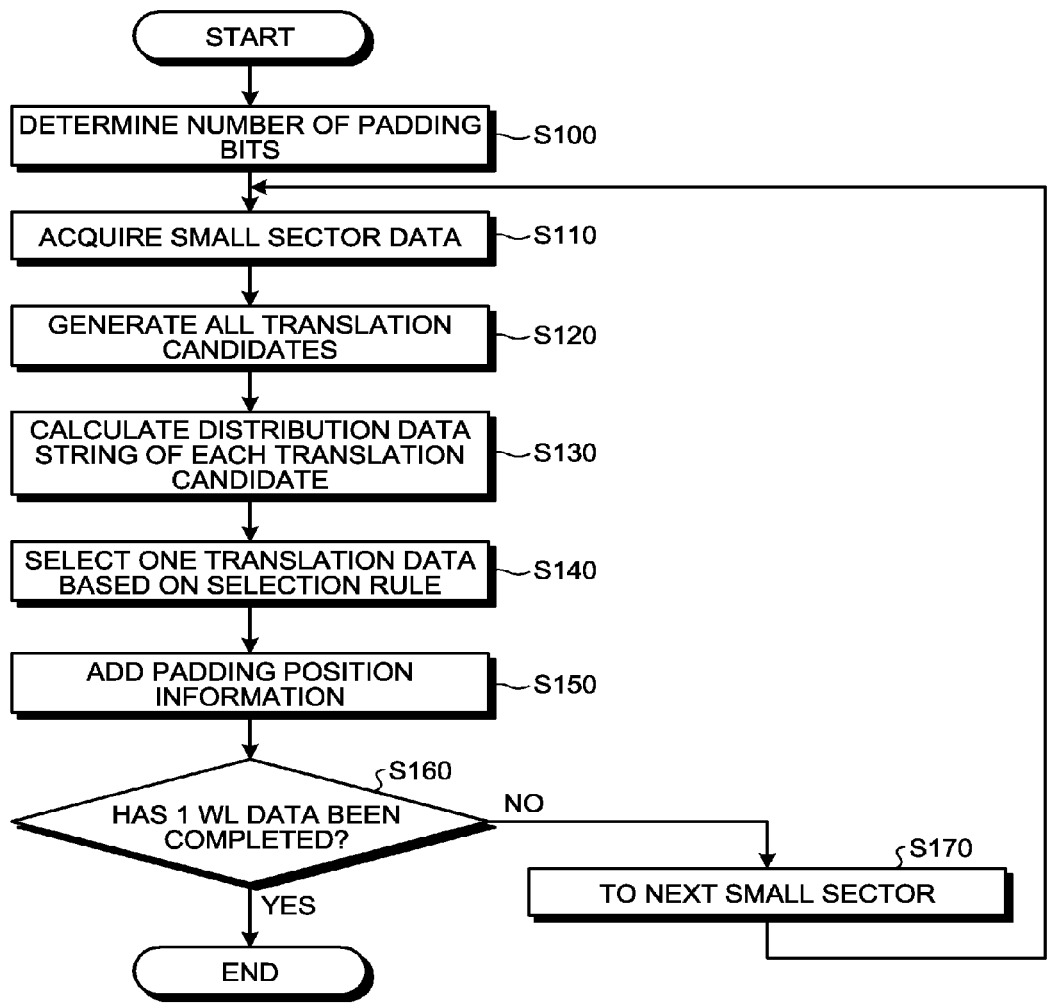
FIG. 10 is a flowchart that illustrates an example of a data translation (coding) process according to a first embodiment.

Hereinafter, a data translation process performed when coding is performed by the data processing unit 50 will be described with reference to a flowchart illustrated in FIG. 10. The data processing unit 50 determines the number q of bits of padding data per one small sector data (Step S100). This number q of bits may be determined based on a compression rate CR in a case where the padding process is performed after compression of write data. In other words, write data is compressed for each small sector data, and the number of bits decreased from the original data through the compression is determined as the number q of bits of the padding data. The number q of bits of the padding data may be determined in advance based on a relation between the number of cells included in one physical sector and the number of bits of a code word included in one page.

The data processing unit 50 acquires one small sector data illustrated in FIG. 8 from lower page data and upper page data included in 1 WL data (Step S110). The data processing unit 50 performs a padding process for the small sector data and generates K data translation candidates including all the combinations #0 to #K−1 illustrated in FIG. 9 (Step S120). The data processing unit 50 generates a distribution data string in which a memory cell number and a threshold voltage distribution are associated with each other for each generated data translation candidate and stores the generated distribution data string (Step S130). The memory cell number is a number of a memory cell that is attached in correspondence with the bit line position (BL0, BL1, . . . ) described above. For example, in a case where the data string of the small sector is "00", "01", "10", "11", . . . as a result of the data translation, a distribution data string in which the distribution B, the distribution A, the distribution C, the distribution Er, . . . and memory cell numbers are associated with each other is stored.

Next, the data processing unit 50 selects one from among the generated K data translation candidates based on a selection rule (Step S140). An example of the selection rule will be described. In the first embodiment, one is selected from among the four data translation candidates based on the following selection rule.

(1) A translation candidate having a smallest number of pairs is selected. The pair is made up of the distribution Er and the distribution C that are adjacent to each other. In other words, a translation candidate having a smallest number of adjacent data patterns for which the Er to A error easily occurs is selected.

(2) In a case where there are a plurality of translation candidates satisfying the condition of "(1)", a translation candidate having a largest number of the distributions Er is selected. In other words, a translation candidate having a lowest degree of fatigue given to the cell is selected.

However, this selection rule is merely an example, and any other arbitrary selection rule may be employed. For example, in order to further decrease the degree of fatigue given to the cell, selecting a translation candidate having less distributions C having a highest threshold voltage may be set as the first condition of the selection rule described above. In other words, it is important to select one from among a plurality of candidates that has the best condition, and the content of the selection rule may be changed into various forms in accordance with the characteristics of a target memory.

Next, the data processing unit 50 adds padding position information PP representing an insertion position of added padding data of one to a plurality of bits to the selected one translation candidate (Step S150). In other words, the data processing unit 50 adds padding position information PP representing an insertion position of the padding data with respect to lower page data to the lower page data in units of small sectors acquired from the selected one translation candidate and adds padding position information PP representing an insertion position of the padding data with respect to upper page data to the upper page data in units of small sectors acquired from the selected one translation candidate. While the padding position information PP may employ an arbitrary format, for example, a bit address of the small sector data is used. It is unnecessary to include information representing whether added padding data is "0" or "1" in the padding position information PP. The reason for this is that the padding data has a meaning only at a writing time and is removed at a reading time. The padding position information PP is added for each lower page data and for each upper page data. The reason for this is that an inverse translation process is performed using only data stored in a page in which reading target data is included at the reading time.

Figure 11A:
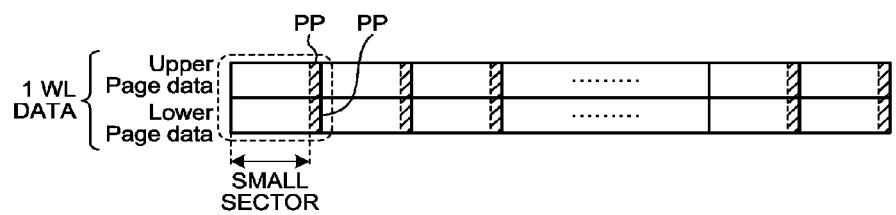
FIGS. 11A and 11B are diagrams that illustrate examples of the arrangement relation between small sector data and flags.
Figure 11B:
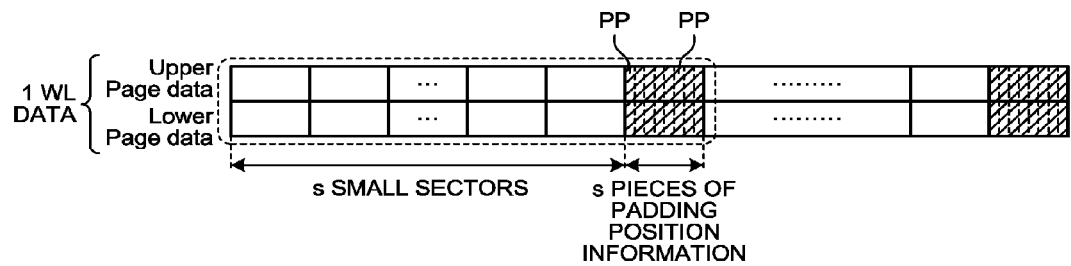

FIGS. 11A and 11B are diagrams that illustrate an example of an arrangement relation between the small sector data and the padding position information PP. The padding position information PP is denoted by a rectangle to which hatching is applied. As illustrated in FIGS. 11A and 11B, padding position information PP representing an insertion position of padding data with respect to upper page data is added to the upper page data included in one small sector data, and padding position information PP representing an insertion position of padding data with respect to lower page data is added to the lower page data included in one small sector data. In the case illustrated in FIG. 11A, the padding position information PP is inserted to the end of each small sector data so as to be adjacent to each one small sector data. In other words, the padding position information PP is added following the small sector data. Accordingly, in the case illustrated in FIG. 11A, the small sector data and the padding position information PP are alternately stored in a physical sector MS. In the case illustrated in FIG. 11B, a plurality of pieces of padding position information PP corresponding to a plurality of (s) small sectors are continuously arranged at one place altogether. In other words, a plurality of pieces of padding position information PP corresponding to a plurality of small sectors are continuously arranged following a plurality of pieces of small sector data. Accordingly, in the case illustrated in FIG. 11B, in a physical sector MS, s pieces of small sector data and s pieces of padding position information PP are alternately stored.

Next, the data processing unit 50 determines whether or not a translation process corresponding to 1 WL data has been completed (Step S160) and, in a case where the translation process has not been completed, sets the translation target to next small sector data (Step S170) and performs the same translation process for the next small sector data (Steps S110 to S150). In this way, the translation process described above is performed for all the small sector data included in the 1 WL data. The small sector data after the translation that includes the padding position information PP is input to the ECC unit 60. In addition, in a case where the number q of bits of the padding data is determined according to the compression rate CR as described above, the process of Step S100 is performed in units of small sector data.

Figure 12:
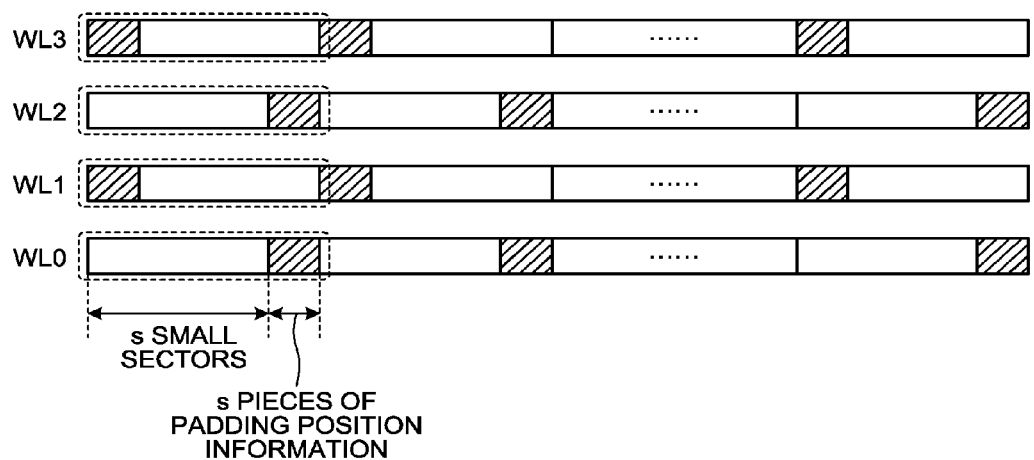
FIG. 12 is a diagram that illustrates an example of an arrangement relation between small sector data and flags in a plurality of pieces of word line data.

Here, in a case where data before the translation that is input to the data processing unit 50 has a random pattern, the padding position information PP is predicted to be random data. As illustrated in FIG. 11B, in a case where the padding position information PP is arranged altogether, there is a possibility that a pattern of C-Er-C or Er-C-Er occurs in a place at which the padding position information PP is arranged altogether. Thus, in order to suppress the occurrence of the pattern of C-Er-C or Er-C-Er between physical sectors adjacent in the word line direction, as illustrated in FIG. 12, a cell position at which the padding position information PP is arranged may be shifted for each word line. In the case illustrated in FIG. 12, in the case of WL data having an even word line number, a plurality of pieces of padding position information PP are arranged at the end of a small sector, and, in the case of WL data having an odd word line number, a plurality of pieces of padding position information PP are arranged at the start of a small sector. While the cell position at which the padding position information PP is arranged may be configured to be different for each word line, as illustrated in FIG. 12, the cell position at which the padding position information PP is arranged may be configured to be different at least between word lines adjacent to each other.

Figure 13:
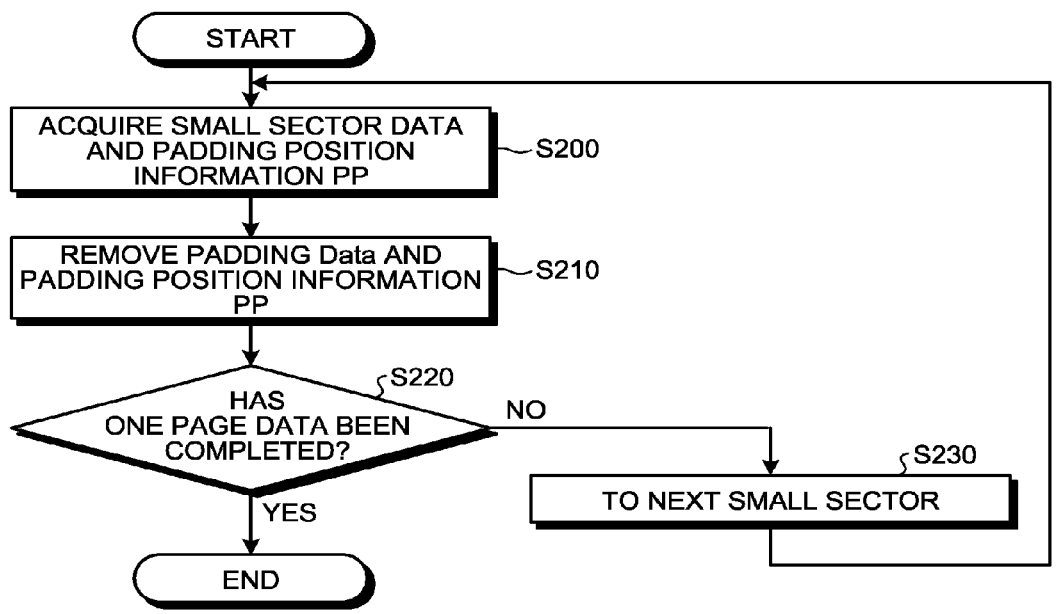
FIG. 13 is a flowchart that illustrates an example of an inverse data translation (decoding) process according to the first embodiment.

Next, a data inverse translation process at the time of decoding that is performed by the data processing unit 50 will be described with reference to a flowchart illustrated in FIG. 13. At the time of decoding, a sequence opposite to that at the time of coding is performed. At the time of coding, a translation process is performed based on 1 WL data. However, at the time of decoding, an inverse translation process is performed by using only data stored in a page in which reading target data is included. In other words, in a case where a reading target page is a lower page, an inverse translation process is performed using only data stored in the lower page, and, in a case where a reading target page is an upper page, an inverse translation process is performed using only data stored in the upper page.

The data processing unit 50 acquires one small sector data and padding position information PP corresponding to this small sector data from page data that is a reading target input from the ECC unit 60 (Step S200). The data processing unit 50 determines an insertion position of the padding data based on the padding position information PP and removes the padding data from the small sector data based on this determination. In addition, the data processing unit 50 removes the padding position information PP (Step S210). The data processing unit 50 inputs the small sector data from which the padding data and the padding position information PP are removed to the RAM 30. The data processing unit 50 determines whether or not an inverse translation process corresponding to one page data has been completed (Step S220) and, in a case where the inverse translation process has not been completed, sets the inverse translation target to next small sector data (Step S230) and performs the same inverse translation process for the next small sector data (Steps S200 to S220). In this way, the inverse translation process is performed for all the small sector data included in one page data. The page data after the inverse translation is input to the RAM 30.

In the embodiment described above, while the data translation performed by the data processing unit 50 is performed in units of small sectors, the data translation may be configured to be performed in units of page data included in 1 WL data. In such a case, padding position information PP is added to the lower page data corresponding to one page and padding position information PP is added to the upper page data corresponding to one page.

In this way, in the first embodiment, a best one is selected from among all the data translation candidates having different padding positions and different padding data. For this reason, a more effective padding process can be reliably selected for the Er to A error and the like. Accordingly, a read error can be effectively decreased by performing the data padding process. In addition, the padding position information PP is added to each page data. For this reason, at the time of reading, a data inverse translation can be performed by using only the data of the own page, and accordingly, a short delay time at the time of reading can be realized.

(Second Embodiment)

In a second embodiment, instead of selecting a best padding pattern from all the combinations, a best one is selected from a part of combinations selected in advance. FIG. 14 is a diagram that illustrates a padding process according to the second embodiment and illustrates L padding patterns. In a case where the number of all the combinations having different padding positions and different padding data is K, L<K. In the case illustrated in FIG. 14, in the case of a padding pattern #0, padding data "0" is inserted between data U0 and data U1, and padding data "1" is inserted between data L2 and data L3. In the case of a padding pattern #1, padding data "1" is inserted between data U1 and data U2, and padding data "0" is inserted between data L3 and data L4. In the case of a padding pattern #L−2, padding data "0" is inserted between data U4 and data U5, and padding data "0" is inserted between data L6 and data L7. In the case of a padding pattern #L−1, padding data "1" is inserted between data U4 and data U5, and padding data "0" is inserted after data L7.

Figure 15:
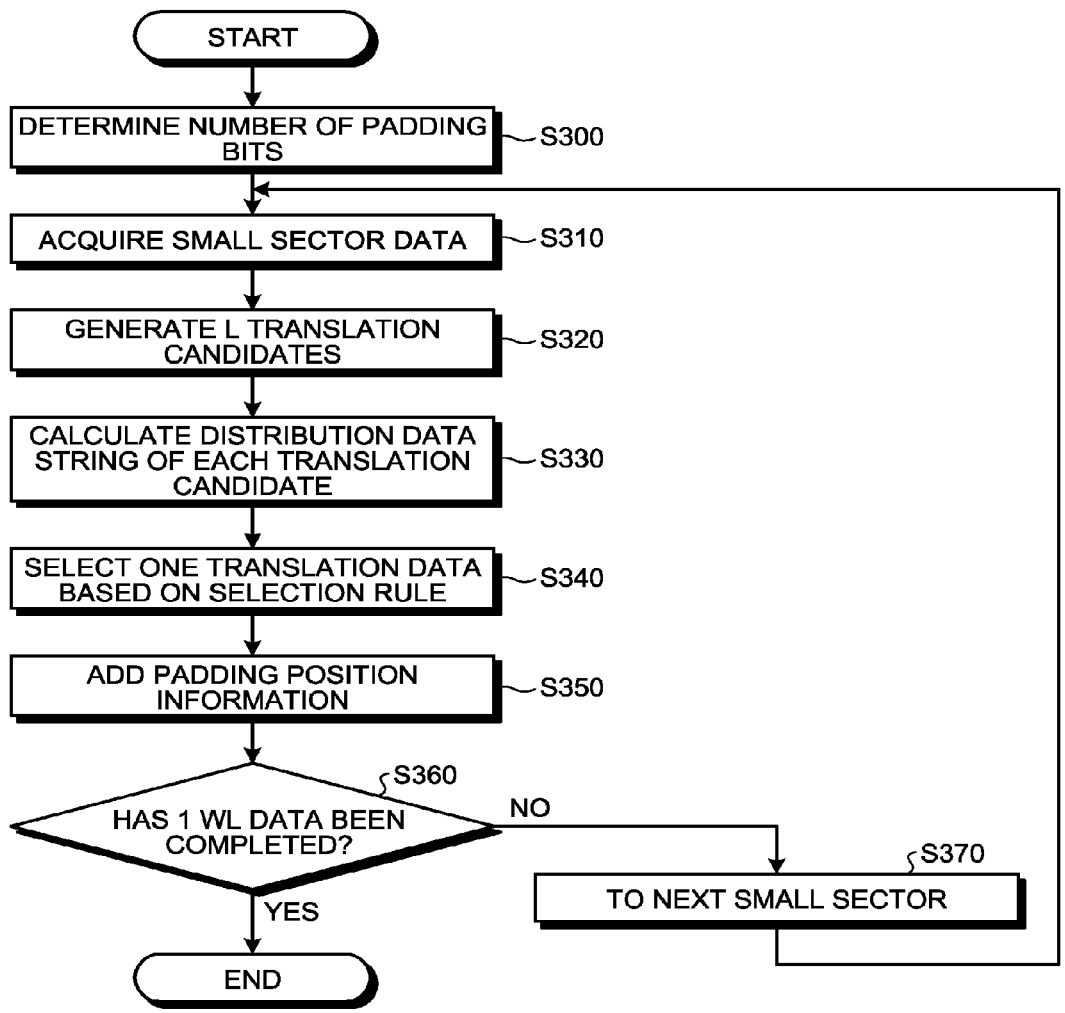
FIG. 15 is a flowchart that illustrates an example of a data translation (coding) process according to a second embodiment.

Hereinafter, a data translation process performed when coding is performed by the data processing unit 50 will be described with reference to a flowchart illustrated in FIG. 15. The data processing unit 50 determines the number q of bits of padding data per one small sector data (Step S300). The data processing unit 50 acquires one small sector data from lower page data and upper page data included in 1 WL data (Step S310). The data processing unit 50 performs a padding process for the small sector data and generates L data translation candidates including the padding patterns #0 to #L−1 illustrated in FIG. 14 (Step S320). The data processing unit 50 generates a distribution data string in which a memory cell number and a threshold voltage distribution are associated with each other for each generated data translation candidate and stores the generated distribution data string (Step S330). Next, the data processing unit 50 selects one from among the generated L data translation candidates based on a selection rule (Step S340).

The data processing unit 50 adds padding position information PP representing an insertion position of added padding data to the selected one translation candidate (Step S350). As the padding position information PP, similar to the first embodiment, while information directly representing an insertion position of the padding data may be added, information used for identifying a padding pattern may be added. For example, pattern numbers are assigned in correspondence with the L padding patterns. Then, a pattern number corresponding to the selected one translation candidate is added as the padding position information PP. The data processing unit 50 stores information representing a correspondence relation between the L pattern numbers and the insertion positions of the padding data and acquires an insertion position of the padding data corresponding to a pattern number by using the stored information at the time of performing a data inverse translation process.

Next, the data processing unit 50 determines whether or not a translation process corresponding to 1 WL data has been completed (Step S360) and, in a case where the translation process has not been completed, sets the translation target to next small sector data (Step S370) and performs the same translation process for the next small sector data (Steps S310 to S350). In this way, the translation process described above is performed for all the small sector data included in the 1 WL data. The small sector data after the translation that includes the padding position information PP is input to the ECC unit 60.

A data inverse translation process according to the second embodiment performed at the time of decoding is the same as the operation according to the first embodiment performed at the time of decoding, and thus, duplicate description will not be presented.

In this way, according to the second embodiment, a best one is selected from among a part of combinations selected in advance. For this reason, although there is a possibility that an error enhancement effect is lower than that of the first embodiment, a data processing time and the padding position information PP can be decreased.

(Third Embodiment)

In a third embodiment, after a best one is selected from L (L<K) combinations selected in advance from all the (K) combinations based on a selection rule, padding data included in the selected one provisional first translation candidate is corrected based on the selection rule, and thus, final translation candidates are acquired. For example, by inverting the padding data included in the selected one provisional first translation candidate as described above from "1" to "0" or from "0" to "1", one to a plurality of second translation candidates are further generated. Then, based on the selection rule, a best one is selected from among the provisional first translation candidate and one to the plurality of the second translation candidates acquired through the data inversion.

In this way, in the third embodiment, since the padding data is inverted later, it is preferable that L combinations are selected such that there is a room for the data inversion of the padding data. For example, L combinations having only mutually-different padding positions are selected, and a best one is selected from among the selected L combinations, and then, one to a plurality of second translation candidates are generated by inverting a part or the whole of the padding data included in the selected one provisional first translation candidate, and a best one is selected from among the first and second translation candidates.

Alternatively, L combinations having different padding positions and different padding data are selected. At the time of performing the selection, regarding the padding position, in a case where four combinations having different padding data are present for one padding position, instead of selecting all the four combinations, three combinations or less are selected so as to make a room for later data inversion. Thereafter, similar to the description presented above, after a best one is selected from among the selected L combinations, one or a plurality of second translation candidates are generated by inverting a part or the whole of padding data included in this selected one provisional first translation candidate, and a best one is selected from among the first and second translation candidates.

Figure 16:
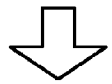
FIG. 16 is a diagram that describes a padding process according to a third embodiment.

FIG. 16 is a diagram that illustrates a data inversion process according to the third embodiment. An upper diagram illustrated in FIG. 16 illustrates a provisional first data translation candidate selected from among L combinations. This provisional first data translation candidate includes an upper page in which padding data "1" is inserted between data U1 and data U2 and lower page in which padding data "0" is inserted between data L3 and data L4. A lower diagram illustrated in FIG. 16 illustrates one second translation candidate in which the padding data is inverted. In this second translation candidate, the padding data between the data L3 and the data L4 is inverted from "0" to "1".

Figure 17:
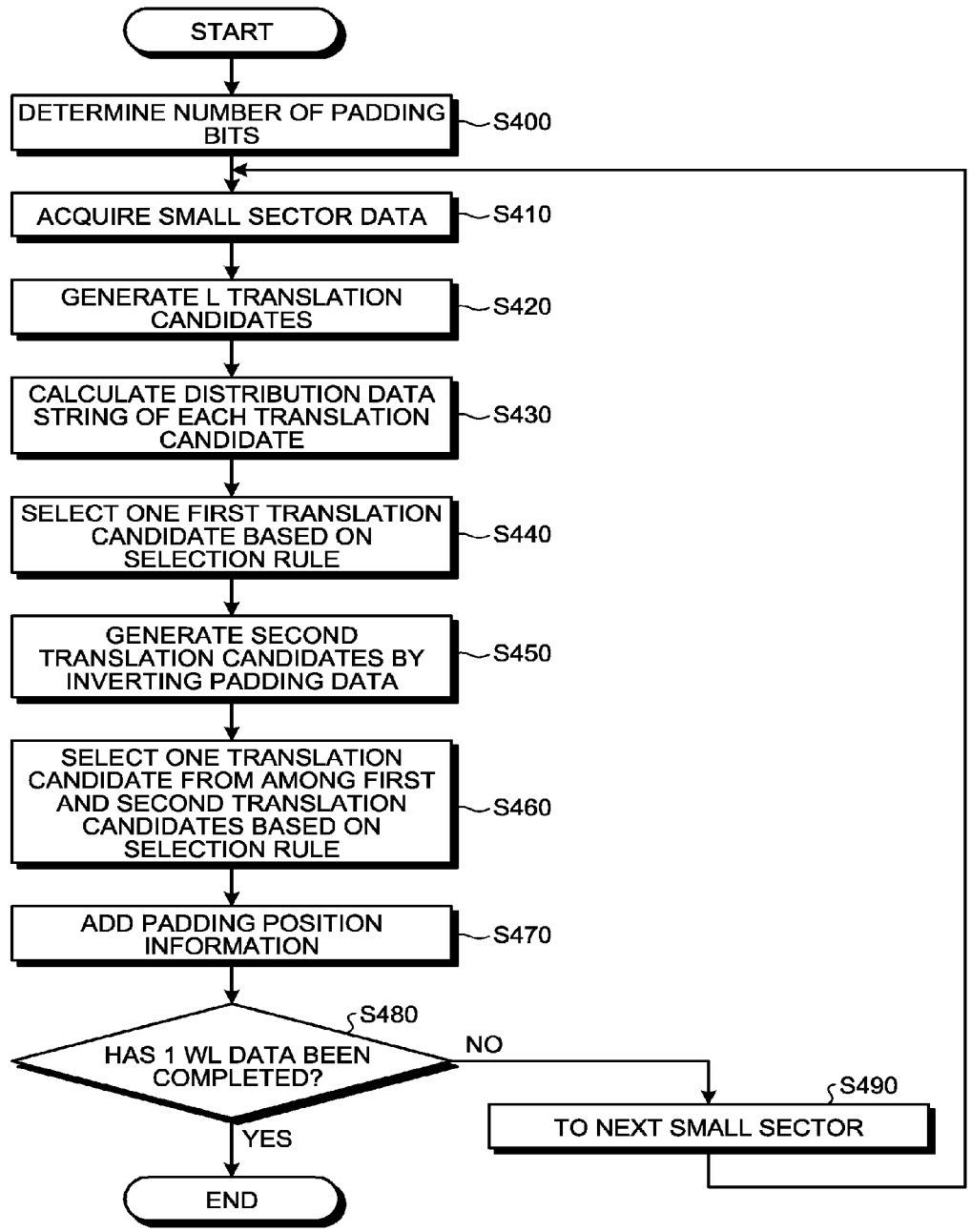
FIG. 17 is a flowchart that illustrates an example of a data translation (coding) process according to a third embodiment.

Hereinafter, a data translation process performed when coding is performed by the data processing unit 50 will be described with reference to a flowchart illustrated in FIG. 17. The data processing unit 50 determines the number q of bits of padding data per one small sector data (Step S400). The data processing unit 50 acquires one small sector data from lower page data and upper page data included in 1 WL data (Step S410). The data processing unit 50 performs a padding process for the small sector data and generates L data translation candidates (Step S420). The data processing unit 50 generates a distribution data string in which a memory cell number and a threshold voltage distribution are associated with each other for each generated data translation candidate and stores the generated distribution data string (Step S430). Next, the data processing unit 50 selects one first translation candidate from among the generated L data translation candidates based on a selection rule (Step S440).

The data processing unit 50 generates one to a plurality of second translation candidates by inverting a part or the whole of padding data included in the selected one first translation candidate (Step S450). The data processing unit 50 generates a distribution data string in which a memory cell number and a threshold voltage distribution are associated with each other for each generated second data translation candidate and stores the generated distribution data string. Next, the data processing unit 50 selects one translation candidate from among the first and second data translation candidates based on a selection rule (Step S460). The data processing unit 50 adds padding position information PP representing an insertion position of added padding data to the selected one translation candidate (Step S470).

Next, the data processing unit 50 determines whether or not a translation process corresponding to 1 WL data has been completed (Step S480) and, in a case where the translation process has not been completed, sets the translation target to next small sector data (Step S490) and performs the same translation process for the next small sector data (Steps S410 to S450). In this way, the translation process described above is performed for all the small sector data included in the 1 WL data. The small sector data after the translation that includes the padding position information PP is input to the ECC unit 60.

A data inverse translation process according to the third embodiment performed at the time of decoding is the same as the operation according to the first embodiment performed at the time of decoding, and thus, duplicate description will not be presented.

In addition, in the third embodiment, a technique presented as below may be employed. First, one first translation candidate is selected from L (L<K) combinations based on a selection rule. The selection rule of this case is to select candidates such that less C-Er-C or Er-C-Er is included. In a case where the pattern of C-Er-C or Er-C-Er is included in the selected one translation candidate, it is determined whether padding data is included in the pattern of C-Er-C or Er-C-Er. In a case where padding data is included, it is determined whether or not the pattern of C-Er-C or Er-C-Er disappears by inverting the padding data. In a case where the pattern of C-Er-C or Er-C-Er disappears, the padding data is inverted. In this way, a final translation candidate is acquired. In this technique, in a case where a pattern of a threshold voltage distribution that is contradictory to the selection rule is present, the padding data is tentatively corrected, and, in a case where the distribution data string is enhanced according to the correction, the padding data is corrected.

In this way, according to the third embodiment, a best data translation candidate is selected from a part of combinations selected in advance, and the padding data of the selected data translation candidate is corrected. For this reason, an error enhancement effect can be improved more than that of the second embodiment.

(Fourth Embodiment)

Figure 18:
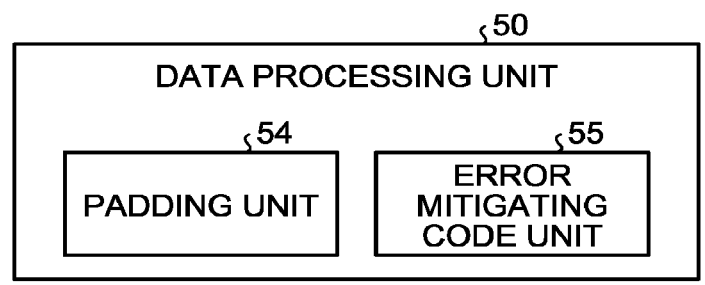
FIG. 18 is a block diagram that illustrates an example of the internal configuration of a data processing unit applied to fourth to sixth embodiments.

FIG. 18 is a diagram that illustrates an example of the internal configuration of a data processing unit 50 applied to fourth to sixth embodiments. The data processing unit 50, in addition to the padding unit 54 that performs the padding process and the padding data removing process described above, includes an error mitigating code unit 55. The error mitigating code unit 55 performs a logical operation of input data with a certain bit pattern. In the fourth to sixth embodiments, for data to be written into the NAND 10, the padding process performed by the padding unit 54 and an error mitigating code process performed by the error mitigating code unit 55 are performed.

A first example of the process performed by the error mitigating code unit 55 will be described with reference to FIG. 19. In the first example, as the logical operation described above, a flipping process inverting input data is employed. The flipping process is equivalent to performing an exclusive OR operation of a bit pattern in which all the bits are "1" and input data. The error mitigating code unit 55 performs a flipping process of inverting input data "0" to "1" and inverting input data "1" to "0". The error mitigating code unit 55 performs the flipping process for each small sector data. In a case where data of N pages is stored in one physical sector MS, the error mitigating code unit 55 can generates a maximum of $2^N$ data translation candidates. A maximum number of data translation candidates that can be generated by the error mitigating code unit 55 for one small sector data is assumed to be R. In the case of N=2, the error mitigating code unit 55 can generate a maximum of four data translation candidates. Four data translations include: a first data translation not performing a flipping process for input data; a second data translation performing a flipping process only for the lower page data of the input data; a third data translation performing a flipping process only for the upper page data of the input data; and a fourth data translation performing a flipping process for the lower page data and the upper page data of the input data.

FIGS. 19A to 19D are diagrams that illustrate data coding corresponding to the four data translations performed by the error mitigating code unit 55. FIG. 19A illustrates threshold voltage distributions Er, A, B, and C of a memory cell of 2 bits/cell and data coding at the time of not performing a data translation, in other words, not performing flipping. On the right side in FIG. 19A, a flag FG "00" respectively added to the upper page data and the lower page data when flipping is not performed is illustrated. FIG. 19B illustrates data coding at the time of flipping only the lower page data for the data coding illustrated in FIG. 19A. On the right side in FIG. 19B, a flag FG "01" respectively added to the upper page data and the lower page data when flipping is performed only for the lower page data is illustrated. FIG. 19C illustrates data coding at the time of flipping only the upper page data for the data coding illustrated in FIG. 19A. On the right side in FIG. 19C, a flag FG "10" respectively added to the upper page data and the lower page data when flipping is performed only for the upper page data is illustrated. FIG. 19D illustrates data coding at the time of flipping the upper page data and the lower page data for the data coding illustrated in FIG. 19A. On the right side in FIG. 19D, a flag FG "11" respectively added to the upper page data and the lower page data when flipping is performed for the upper page data and the lower page data is illustrated.

As illustrated in FIG. 19A, when flipping is not performed, the flag FG "0" is added to the lower page data, and the flag FG "0" is added to the upper page data. In the case illustrated in FIG. 19B, compared to the case illustrated in FIG. 19A, the distributions Er and C are interchanged, and the distributions A and B are interchanged. As illustrated in FIG. 19B, when only the lower page data is flipped, the flag FG "1" is added to the lower page data, and the flag FG "0" is added to the upper page data. In the case illustrated in FIG. 19C, compared to the case illustrated in FIG. 19A, the distributions Er and A are interchanged, and the distributions B and C are interchanged. As illustrated in FIG. 19C, when only the upper page data is flipped, the flag FG "0" is added to the lower page data, and the flag FG "1" is added to the upper page data. In the case illustrated in FIG. 19D, compared to the case illustrated in FIG. 19A, the distributions Er and B are interchanged, and the distributions A and C are interchanged. As illustrated in FIG. 19D, when the upper page data and the lower page data are flipped, the flag FG "1" is added to the lower page data, and the flag FG "1" is added to the upper page data.

A second example of the process performed by the error mitigating code unit 55 will be described with reference to FIGS. 20 to 22. In the second example, as the logical operation, an exclusive OR operation (hereinafter, abbreviated to an XOR operation) is employed. The error mitigating code unit 55 performs an exclusive OR operation (hereinafter, abbreviated to an XOR operation) of input data with a certain bit pattern. FIG. 20 illustrates a content of an XOR operation. As illustrated in a first stage in FIG. 20, when data before translation is "0", and one bit of a fixed bit pattern is "0", an output after the XOR operation is "0". As illustrated in a second stage in FIG. 20, when data before translation is "0", and one bit of the fixed bit pattern is "1", an output after the XOR operation is "1". As illustrated in a third stage in FIG. 20, when data before translation is "1", and one bit of the fixed bit pattern is "0", an output after the XOR operation is "1". As illustrated in a fourth stage in FIG. 20, when data before translation is "1", and one bit of the fixed bit pattern is "1", an output after the XOR operation is "0".

FIGS. 21A to 21D are diagrams that illustrate four data translations performed by the error mitigating code unit 55 in a case where data writing of two bits/cell is performed in the NAND 10. FIG. 21E is a diagram that illustrates an example of the fixed bit pattern that is one input at the time of performing an XOR operation. FIG. 21A illustrates a data pattern when an XOR operation is not performed for upper page data and lower page data. Thus, FIG. 21A illustrates an example of a data pattern of the upper page and an example of a data pattern of the lower page before a data translation. On the right side in FIG. 21A, a flag FG "00" respectively added to the upper page data and the lower page data when a data translation is not performed is illustrated. FIG. 21B illustrates an output data pattern when an XOR operation of only the lower page data and the bit pattern illustrated in FIG. 21E is performed for the data pattern illustrated in FIG. 21A. On the right side in FIG. 21B, a flag FG "01" respectively added to the upper page data and the lower page data when a data translation is performed only for the lower page data is illustrated. FIG. 21C illustrates an output data pattern when an XOR operation of only the upper page data and the bit pattern illustrated in FIG. 21E is performed for the data pattern illustrated in FIG. 21A. On the right side in FIG. 21C, a flag FG "10" respectively added to the upper page data and the lower page data when a data translation is performed only for the upper page data is illustrated. FIG. 21D illustrates an output data pattern when an XOR operation of the lower page data and the upper page data and the bit pattern illustrated in FIG. 21E is performed for the data pattern illustrated in FIG. 21A. On the right side in FIG. 21D, a flag FG "11" respectively added to the upper page data and the lower page data when a data translation is performed for the lower page data and the upper page data is illustrated.

As illustrated in FIGS. 21A to 21D, by determining whether the flag FG added to the upper page data is "0" or "1", it can be determined whether or not a data translation is performed for the upper page data. In addition, by determining whether the flag FG added to the lower page data is "0" or "1", it can be determined whether or not a data translation is performed for the lower page data.

In addition, the bit pattern used for the XOR operation may not be a fixed pattern but be selected from a plurality of mutually-different bit patterns.

Here, in the fourth embodiment, the padding unit 54, similar to the first embodiment, generates all the (K) data translation candidates having different padding positions and different padding data. The error mitigating code unit 55 performs an error mitigating code process for generating all the (R) data translation candidates described above for the K data translation candidates generated by the padding unit 54. As a result, the error mitigating code unit 55 generates K×R data translation candidates. The data processing unit 50 selects a best data translation candidate from among the generated K×R data translation candidates based on a selection rule.

Hereinafter, a data translation process performed when coding is performed by the data processing unit 50 will be described with reference to a flowchart illustrated in FIG. 22. The data processing unit 50 determines the number q of bits of padding data per one small sector data (Step S500). The data processing unit 50 acquires one small sector data illustrated in FIG. 8 from lower page data and upper page data included in 1 WL data (Step S510). The padding unit 54 performs a padding process for the small sector data and generates K data translation candidates including all the combinations #0 to #K−1 illustrated in FIG. 9. The error mitigating code unit 55 performs an error mitigating code process for generating R data translation candidates of a maximal number for the K data translation candidates generated by the padding unit 54. As a result, the error mitigating code unit 55 generates K×R data translation candidates (Step S520). The data processing unit 50 generates a distribution data string in which a memory cell number and a threshold voltage distribution are associated with each other for each generated data translation candidate and stores the generated distribution data string (Step S530).

Next, the data processing unit 50 selects one from among the generated K×R data translation candidates based on a selection rule (Step S540). The data processing unit 50 adds translation information TI representing the content of the translation performed by the data processing unit 50 to the selected one translation candidate (Step S550). This translation information TI, for example, includes padding position information PP representing an insertion position of added padding data of one to a plurality of bits and a flag FG representing the content of the translation performed by the error mitigating code unit 55. In other words, the data processing unit 50 adds the translation information TI including padding position information PP representing an insertion position of padding data with respect to the lower page data and a flag FG representing the content of the translation for the lower page data to the lower page data in units of small sectors acquired by the selected one translation and adds the translation information TI including padding position information PP representing an insertion position of padding data with respect to the upper page data and a flag FG representing the content of the translation for the upper page data to the upper page data in units of small sectors acquired by the selected one translation.

Next, the data processing unit 50 determines whether or not a translation process corresponding to 1 WL data has been completed (Step S560) and, in a case where the translation process has not been completed, sets the translation target to next small sector data (Step S570) and performs the same translation process for the next small sector data (Steps S510 to S550). In this way, the translation process described above is performed for all the small sector data included in the 1 WL data. The small sector data after the translation that includes the translation information TI is input to the ECC unit 60.

Figure 23:
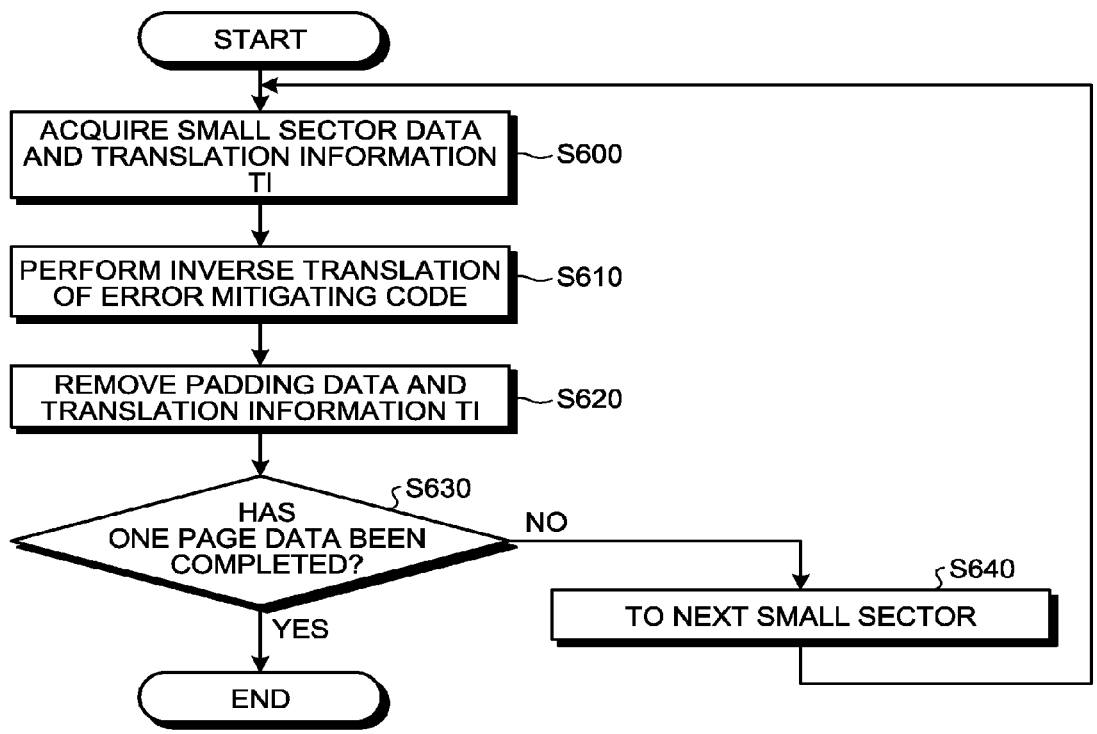
FIG. 23 is a flowchart that illustrates an example of an inverse data translation (decoding) process according to the fourth embodiment.

Next, a data inverse translation process at the time of decoding performed by the data processing unit 50 will be described with reference to a flowchart illustrated in FIG. 23. At the time of decoding, a sequence opposite to that at the time of coding is performed. At the time of decoding, an inverse translation process is performed using only data stored in a page in which reading target data is included. In other words, in a case where the reading target page is a lower page, the inverse translation process is performed using only data stored in the lower page, and, in a case where the reading target page is an upper page, the inverse translation process is performed using only data stored in the upper page.

The data processing unit 50 acquires one small sector data and translation information TI corresponding to this small sector data from reading target page data input from the ECC unit 60 (Step S600). The error mitigating code unit 55 performs an inverse translation process of small sector data based on a flag FG included in the translation information TI (Step S610). In other words, the error mitigating code unit 55 determines whether the flag FG included in the translation information TI is "0" or "1" and determines whether or not a translation process (for example, a flipping process) is performed for the small sector data. In a case where the flag FG represents that the translation process is performed, the error mitigating code unit 55 performs an inverse translation (for example, flipping) of the small sector data. On the other hand, in a case where the flag FG represents that the translation process is not performed, the error mitigating code unit 55 does not perform an inverse translation of the small sector data. The error mitigating code unit 55 removes the flag FG. The error mitigating code unit 55 inputs a result of the inverse translation process to the padding unit 54.

Next, the padding unit 54 of the data processing unit 50 determines an insertion position of the padding data based on the padding position information PP included in the translation information TI and removes the padding data from the result of the inverse translation process based on the determination. In addition, the padding unit 54 removes the padding position information PP (Step S620). The data processing unit 50 inputs the small sector data from which the padding data and the translation information TI have been removed to the RAM 30. The data processing unit 50 determines whether or not an inverse translation process corresponding to one page data has been completed (Step S630) and, in a case where the inverse translation process has not been completed, sets the inverse translation target to next small sector data (Step S640) and performs the same inverse translation process for the next small sector data (Steps S600 to S620). In this way, the inverse translation process described above is performed for all the small sector data included in one page data. The page data after the inverse translation is input to the RAM 30.

In this way, according to the fourth embodiment, a best one is selected from among all the data translation candidates including all the data translation candidates having different padding positions and different padding data and including all the translation candidates used for performing the error mitigating code process. For this reason, a padding process and an error mitigating code process that are more effective for the Er to A error and the like can be reliably selected. Accordingly, a read error according to the data padding process and the error mitigating code process can be effectively decreased. In addition, the translation information TI is added to each page data. For this reason, at the time of reading, a data inverse translation can be performed using only own page data, and accordingly, a short delay time at the time of reading can be realized.

In addition, at the time of writing, it may be configured such that, initially, the error mitigating code process is performed by the error mitigating code unit 55, and thereafter, the padding process is performed by the padding unit 54. Furthermore, at the time of reading, it may be configured such that, initially, the padding process is performed by the padding unit 54, and thereafter, the error mitigating code process is performed by the error mitigating code unit 55.

(Fifth Embodiment)

A data processing unit 50 according to a fifth embodiment, similar to the fourth embodiment, includes a padding unit 54 and an error mitigating code unit 55. In this fifth embodiment, the padding unit 54, similar to the second embodiment, generates L data translation candidates that are a part of combinations selected in advance. When the number of all the combinations having different padding positions and different padding data is K, L<K. For each of L data translation candidates generated by the padding unit 54, the error mitigating code unit 55 performs an error mitigating code process for generating all the (R) data translation candidates described above. As a result, the error mitigating code unit 55 generates L×R data translation candidates. The data processing unit 50 selects a best data translation candidate from among the generated L×R data translation candidates based on a selection rule.

The data processing unit 50 adds translation information TI representing the content of the translation performed by the data processing unit 50 to the selected one translation candidate. This translation information TI, for example, includes padding position information PP representing an insertion position of added padding data of one to a plurality of bits and a flag FG representing the content of the translation performed by the error mitigating code unit 55. As the padding position information PP, as described above, information used for identifying a padding pattern may be added. The other sequence of the fifth embodiment is similar to the process of the fourth embodiment described above, and duplicate description will not be presented.

In the fifth embodiment, the error mitigating code unit 55 may be configured not to generated all the (R) data translation candidates but to generate R' data translation candidates that are a part of the translation candidates. In such a case, as a result, L×R' data translation candidates are generated.

In this way, according to the fifth embodiment, a best one is selected from among a plurality of data translation candidates including a part of data translation candidates having different padding positions and different padding data and including all or a part of translation candidates for performing the error mitigating code process. For this reason, while there is a possibility that an error enhancement effect is lower than that of the fourth embodiment, the data processing time and the translation information TI can be decreased.

(Sixth Embodiment)

In a sixth embodiment, one provisional first translation candidate is selected from among L×R (or L×R') data translation candidates generated in the fifth embodiment based on a selection rule, and padding data included in this selected one provisional first translation candidate is corrected based on the selection rule, and thus, final translation candidates are acquired. For example, by inverting the padding data included in the selected one provisional first translation candidate from "1" to "0" or "0" to "1", one to a plurality of second translation candidates are further generated. Then, based on the selection rule, a best one is selected from among the provisional first translation candidate and one to the plurality of second translation candidates for which data inversion has been performed.

Figure 24:
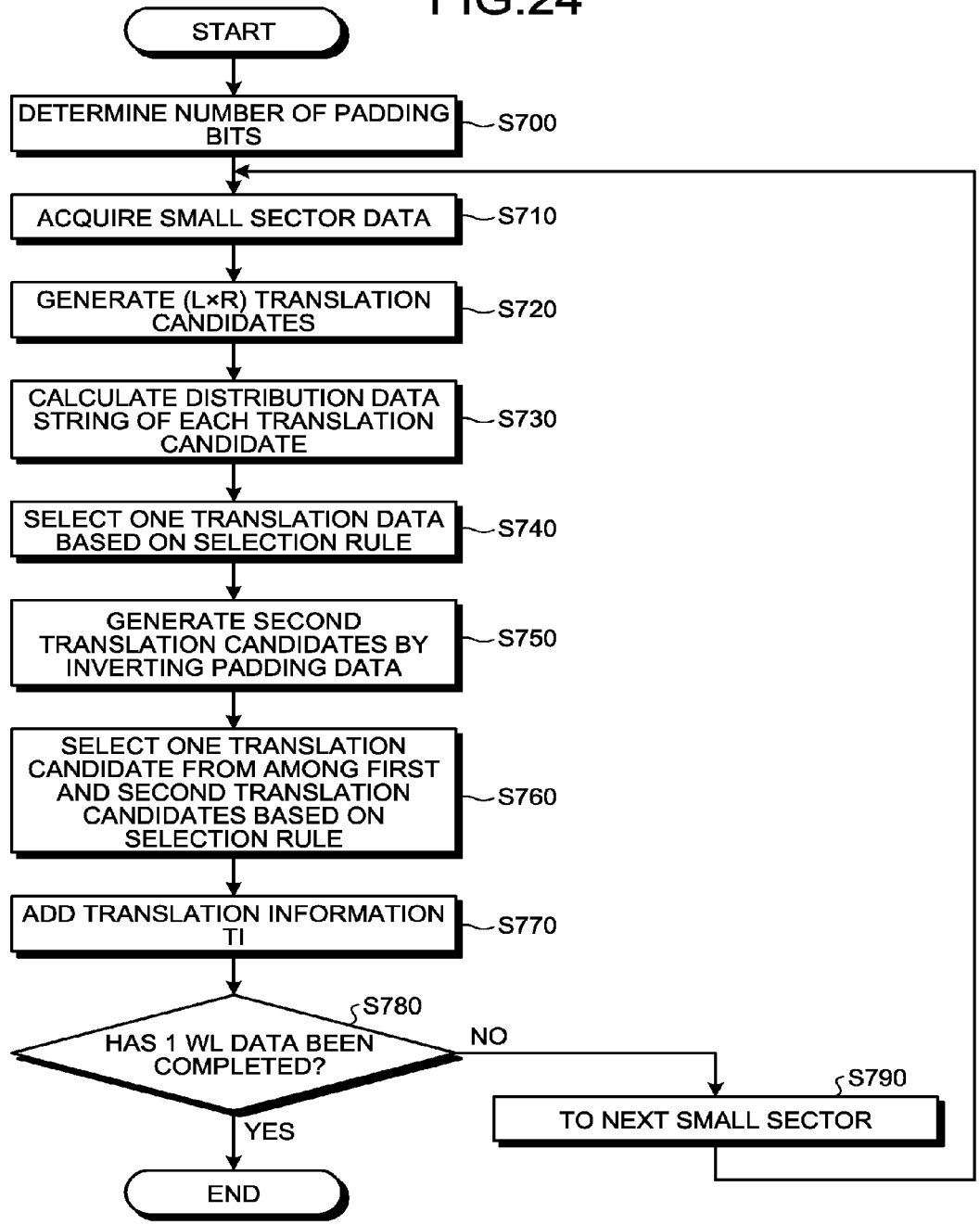
FIG. 24 is a flowchart that illustrates an example of a data translation (coding) process according to a sixth embodiment.

Hereinafter, a data translation process performed when coding is performed by a data processing unit 50 will be described with reference to a flowchart illustrated in FIG. 24. The data processing unit 50 determines the number q of bits of padding data per one small sector data (Step S700). The data processing unit 50 acquires one small sector data from lower page data and upper page data included in 1 WL data (Step S710). A padding unit 54 of the data processing unit 50 performs a padding process for the small sector data and generates L data translation candidates that are a part of combinations selected in advance. An error mitigating code unit 55 of the data processing unit 50 performs an error mitigating code process used for generating all the (R) data translation candidates described above for each of the L data translation candidates generated by the padding unit 54. As a result, the error mitigating code unit 55 generates L×R data translation candidates (Step S720). The data processing unit 50 generates a distribution data string in which a memory cell number and a threshold voltage distribution are associated with each other for each generated data translation candidate and stores the generated distribution data string (Step S730). Next, the data processing unit 50 selects one first translation candidate from among the generated L×R data translation candidates based on a selection rule (Step S740).

The data processing unit 50 generates one to a plurality of second translation candidates by inverting a part or the whole of padding data included in the selected one first translation candidate (Step S750). The data processing unit 50 generates a distribution data string in which a memory cell number and a threshold voltage distribution are associated with each other for each of the generated second data translation candidates and stores the generated distribution data string. Next, the data processing unit 50 selects one translation candidate from among the first and second data translation candidates based on a selection rule (Step S760). The data processing unit 50 adds translation information TI representing the content of the translation performed by the data processing unit 50 to the selected one translation candidate (Step S770). This translation information TI, for example, as described above, includes padding position information PP representing an insertion position of added padding data of one to a plurality of bits and a flag FG representing the content of the translation performed by the error mitigating code unit 55. As the padding position information PP, as described above, information used for identifying a padding pattern may be added.

Next, the data processing unit 50 determines whether or not a translation process corresponding to 1 WL data has been completed (Step S780) and, in a case where the translation process has not been completed, sets the translation target to next small sector data (Step S790) and performs the same translation process for the next small sector data (Steps S710 to S770). In this way, the translation process described above is performed for all the small sector data included in the 1 WL data. The small sector data after the translation that includes the translation information TI is input to the ECC unit 60.

A data inverse translation process according to the sixth embodiment performed at the time of decoding is the same as the operation according to the fourth embodiment performed at the time of decoding, and thus, duplicate description will not be presented.

In the sixth embodiment, a technique presented as below may be employed. In other words, in a case where a pattern of a threshold voltage distribution that is contradictory to the selection rule is present in the one provisional first translation candidate selected from among L×R data translation candidates, padding data is tentatively corrected, and, in a case where the distribution data string is enhanced according to the correction, the padding data is corrected.

In this way, according to the sixth embodiment, a best one is selected from among a plurality of data translation candidates including a part of data translation candidates having different padding positions and different padding data and including all or a part of translation candidates for performing the error mitigating code process, and the padding data of the selected data translation candidate is corrected. For this reason, compared to the fifth embodiment, the error enhancement effect can be improved.

(Seventh Embodiment)

In the first to sixth embodiments, the selection rule used for selecting one selection candidate from among a plurality of data translation candidates is fixed regardless of the wear or the deterioration of the NAND 10 of the memory system 100. The selection rule, as described above, is largely divided into a first selection rule and a second selection rule.

According to the first selection rule, a translation candidate is selected based on a number of distributions C having a highest threshold voltage or a number of distributions Er having a lowest threshold voltage. For example, according to the first selection rule, a translation candidate having a smallest number of distributions C having a highest threshold voltage or a translation candidate having a largest number of distributions Er having a lowest threshold voltage is selected. The first selection rule can improve the endurance of each memory cell by decreasing the degree of fatigue given to the cell and contributes to an increase in the life of the NAND 10. In addition, impacts on the endurance of the memory cells may be determined based on a number of a plurality of kinds of distributions having high threshold voltage. In a case of the TLC mode, eight distributions formed by a distribution Er, a distribution A, a distribution B, a distribution C, a distribution D, a distribution E, a distribution F, and a distribution G are included. The distribution Er has a lowest threshold voltage, the distribution A has a second lowest threshold voltage, . . . , the distribution F has a second highest threshold voltage, and the distribution G has a highest threshold voltage. The translation candidate may be selected based on a number of the distribution F and a number of the distribution G that are two distributions having second highest and highest voltage.

According to the second selection rule, by selecting a translation candidate having a smallest number of adjacent data patterns for which the Er to A error can easily occur, an interference between adjacent cells is suppressed. According to the second selection rule, the number of bits of a read error can be decreased. According to the second selection rule, a translation candidate is selected based on an arrangement of distributions C having a highest threshold voltage and distributions Er having a lowest threshold voltage. For example, according to the second selection rule, the data translation candidate having a smallest number of pairs is selected. The pair is made up of distributions C having a highest threshold voltage and distributions Er having a lowest threshold voltage that are adjacent to each other. In a case where a plurality of translation candidates having a smallest number of adjacent data patterns for which the Er to A error can easily occur are present, by selecting a translation candidate having a largest number of the distributions Er or a translation candidate having a smallest number of the distributions C, a translation candidate giving a lower degree of fatigue to the cell is selected. In addition, with respect to the second selection rule, selecting the translation candidate having a smallest number of C-Er-C patterns and/or Er-C-Er patterns may be adopted.

In an early stage representing a first half of the life time of the memory system 100, the wear of the NAND 10 does not progress, and the bit error rate of read data is low. In the early stage in which the bit error rate is low, an error bit can be corrected through an error correction process performed by the ECC unit 60. On the other hand, in a late stage representing a second half of the life time of the memory system 100, the wear of the NAND 10 progresses, and the bit error rate of read data increases. In the late stage in which the bit error rate increases, there is a possibility that the correction of an error bit fails also through the error correction process performed by the ECC unit 60.

Thus, in the seventh embodiment, the first selection rule is applied to the early stage, and the second selection rule is applied to the late stage. In this way, according to the seventh embodiment, the read error is decreased, and the life time of the NAND 10 can be lengthened. The early stage described above, for example, represents a period from the first start-up of the memory system 100 to when a parameter used for determining the degree of wear exceeds a threshold. The late stage described above, for example, represents a period after the parameter used for determining the degree of wear exceeds the threshold as the wear of the NAND 10 progresses. A time point at which the parameter used for determining the degree of wear coincides with the threshold may be included in either the early stage or the late stage.

Figure 25:
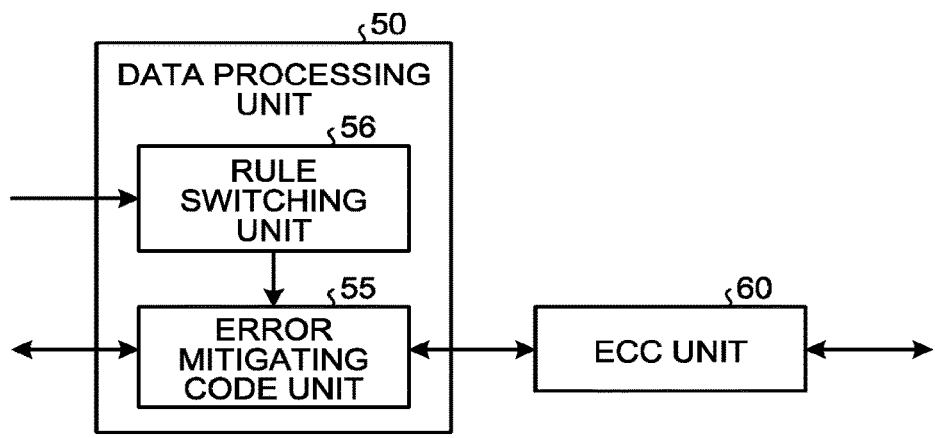
FIG. 25 is a block diagram that illustrates an example of the internal configuration of a data processing unit applied to a seventh embodiment.

FIG. 25 is a diagram that illustrates an example of the internal configuration of a data processing unit 50 applied to a seventh embodiment. In the seventh embodiment, the data processing unit 50 includes an error mitigating code unit 55 and a rule switching unit 56. In description presented below, the data processing unit 50 is assumed not to perform the padding process described above but to perform only an error mitigating code process. The error mitigating code unit 55 performs the flipping process described above or a logical operation such as an XOR operation. In a case where data of two pages is stored in one physical sector MS, the error mitigating code unit 55, as described above, generates four data translation candidates for each small sector data and selects one translation candidate from among the generated four data translation candidates based on a selection rule. The error mitigating code unit 55 outputs the data of the selected one translation candidate and a flag FG representing the content of the data translation to the ECC unit 60.

In the error mitigating code unit 55, as default, the first selection rule described above is implemented. The rule switching unit 56 determines switching timing from the early stage to the late stage based on the parameter used for determining the degree of wear of the NAND 10 that is input from a control unit 20. In a case where the switching timing from the early stage to the late stage is determined, the rule switching unit 56 switches the selection rule implemented in the error mitigating code unit 55 from the first selection rule to the second selection rule.

As trigger parameters used for determining the degree of wear, for example, a total number of erasing/a total number of programming, the number of program loops/the number of erasing loops, the number of failed bits during program verification/the number of failed bits during erasing verification, an appearance ratio of retry read are employed. In addition, the rule switching unit 56 may switch from the first selection rule to the second selection rule by using an instruction from a host 1 as a trigger.

The total number of erasing is the number of erasing when the NAND 10 is viewed as a whole. The total number of erasing is a counter value that increments by one each time when one block disposed inside the NAND 10 is erased. Similarly, the total number of programming is the number of programming when the NAND 10 is viewed as a whole. The total number of programming is a counter value that increments by one each time when one page or one block disposed inside the NAND 10 is programmed.

The number of program loops is the number of iterations of the application of a voltage at the time of programming. At the time of programming, a verifying operation is performed every time when a program voltage is applied to a memory cells, and, in a case where electric charge is not injected until the voltage exceeds a verification voltage, an operation of increasing the program voltage and verifying the voltage is repeated until normal electric charge is injected or until the number of repetitions arrives at a maximum value. The number of program loops, for example, is calculated based on the number of loops for a plurality of physical sectors included in the NAND 10. In order to calculate the number of program loops, the numbers of loops of all the physical sectors included in the NAND 10 may be acquired. In addition, the number of program loops may be calculated based on the numbers of loops of a plurality of specific physical sectors selected in advance as sample targets. For example, the numbers of loops of a plurality of physical sectors that are sample targets are acquired, and an average value or a maximum value thereof is set as the number of program loops. The number of erasing loops, similarly, is the number of repetitions of the application of a voltage at the time of erasing.

The number of failed bits during program verification is the number of bits of a memory cell not passing verification during programming and verification described above during a period of programming and verification. At the time of performing program verification, for example, when the number of memory cells passing verification among memory cells included in a physical sector is a threshold or less, a write operation is determined to be successful, and the program operation is ended. For example, the numbers of failed bits of a plurality of physical sectors disposed inside the NAND 10 are acquired, and an average value or a maximum value thereof is determined as the number of failed bits. The number of failed bits during erasing verification, similarly, is the number of bits of memory cells not passing verification during a period of erasing and verification.

The appearance ratio of retry read represents a ratio of data failing in an error correction performed by the ECC unit 60 to data read using a default read voltage. In a case where data read using a default read voltage fails in the error correction performed by the ECC unit 60, retry read for changing a read voltage and performing re-read is performed. In other words, the appearance ratio of retry read represents a ratio of execution of retry read for read data. For example, an occurrence rate of retry read in a certain period is set as the appearance ratio of retry read.

Figure 26:
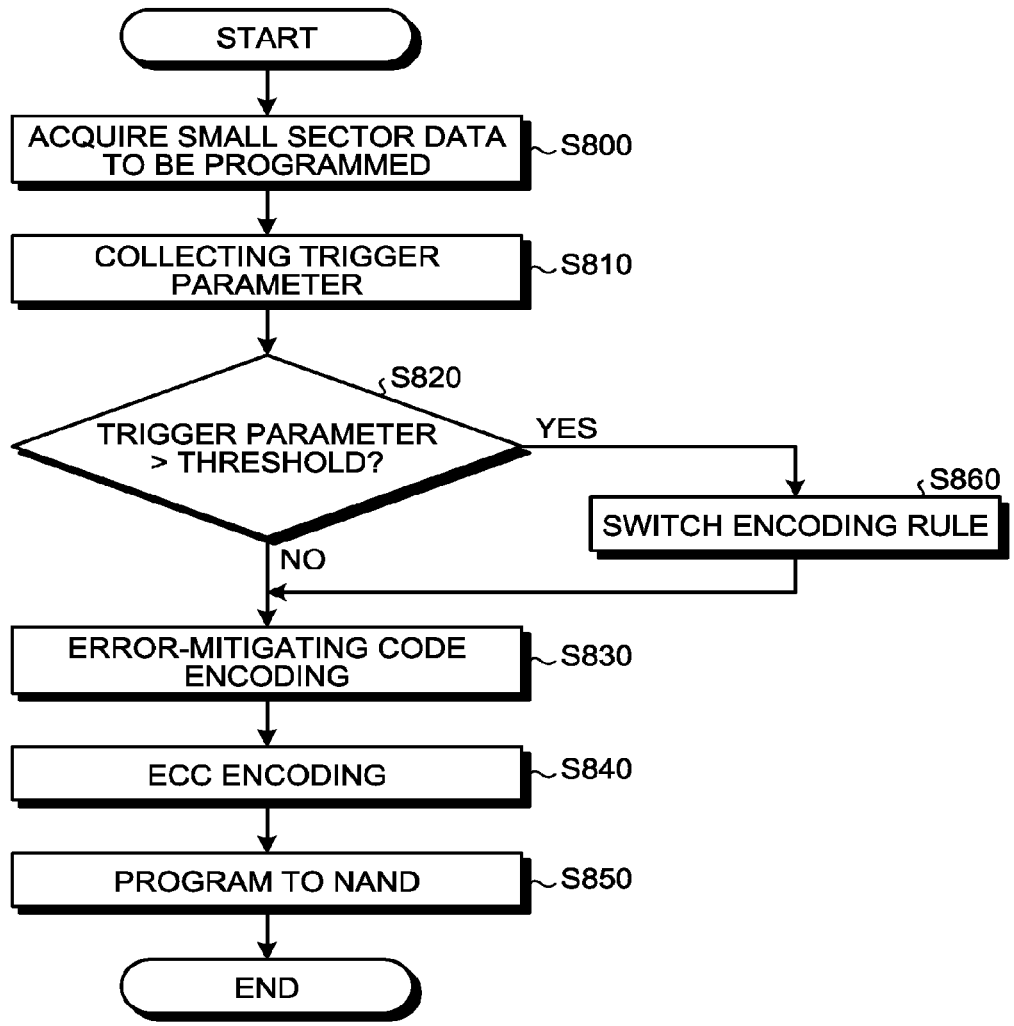
FIG. 26 is a flowchart that illustrates an example of a data translation (coding) process according to the seventh embodiment.

Hereinafter, the process performed at the time of coding will be described with reference to a flowchart illustrated in FIG. 26. The data processing unit 50 acquires one small sector data from lower page data and upper page data included in 1 WL data (Step S800). The rule switching unit 56 collects the trigger parameter used for determining the degree of wear from the control unit 20 (Step S810). The rule switching unit 56 compares the collected trigger parameter with a threshold (Step S820).

In a case where the trigger parameter does not exceed the threshold (Step S820: No), the rule switching unit 56 does not perform any process. In the error mitigating code unit 55, as default, the first selection rule described above is implemented. The error mitigating code unit 55 performs the error mitigating code process described above for data to be written into the NAND 10 based on the first selection rule (Step S830). In other words, the error mitigating code unit 55 performs the error mitigating code process used for generating a plurality of data translation candidates for each small sector data. The error mitigating code unit 55 generates a distribution data string in which a memory cell number and a threshold voltage distribution is associated with each other for each generated data translation candidate and stores the generated data translation candidate. The error mitigating code unit 55 selects one from among a plurality of data translation candidates based on the first selection rule. The error mitigating code unit 55 adds a flag FG representing the content of the data translation to the selected one translation candidate. The error mitigating code unit 55 inputs the translation data and the flag FG to the ECC unit 60. The ECC unit 60 encodes the translation data and the flag FG that have been input (Step S840). A code word generated by the encoding is input to the NAND 10 through a memory I/F 4 and is programmed in the NAND 10 (Step S850).

On the other hand, in a case where the trigger parameter exceeds the threshold in Step S820 (Step S820: Yes), the rule switching unit 56 switches the selection rule implemented in the error mitigating code unit 55 from the first selection rule to the second selection rule (Step S860). The error mitigating code unit 55 performs the error mitigating code process described above for data written into the NAND 10 based on the second selection rule (Step S830). The error mitigating code unit 55 inputs the translation data and the flag FG to the ECC unit 60. The ECC unit 60 encodes the translation data and the flag FG that have been input (Step S840). A code word corresponding to 1 WL data generated by the encoding is input to the NAND 10 through the memory I/F 4 and is programmed in the NAND 10 (Step S850).

Figure 27:
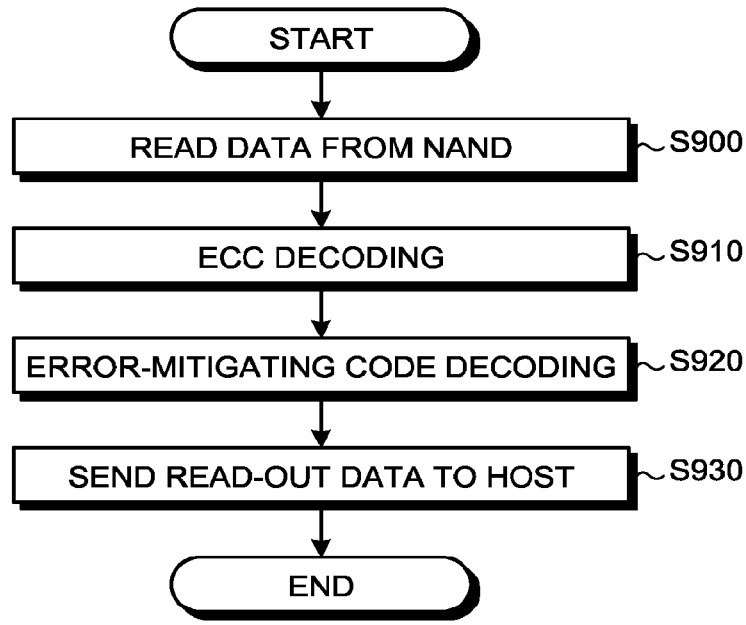
FIG. 27 is a flowchart that illustrates an example of an inverse data translation (decoding) process according to the seventh embodiment.

Next, a process performed at the time of decoding will be described with reference to a flowchart illustrated in FIG. 27. At the time of decoding, an inverse sequence of that performed at the time of coding is performed. At the time of decoding, an inverse translation process is performed using only data stored in a page in which reading target data is included. In other words, in a case where the reading target page is a lower page, the inverse translation process is performed using only data stored in the lower page, and, in a case where the reading target page is an upper page, the inverse translation process is performed using only data stored in the upper page.

The control unit 20 reads a code word from a reading target page of the NAND 10 (Step S900). The ECC unit 60 decodes the read code word (Step S910). The error mitigating code unit 55 acquires one small sector data and a flag FG corresponding to the small sector data from reading target page data input from the ECC unit 60. The error mitigating code unit 55 performs an inverse translation process for the small sector data based on the flag FG (Step S920). The error mitigating code unit 55 removes the flag FG. The error mitigating code unit 55 stores a result of the inverse translation process in the RAM 30. For all the small sector data included in one page data, the inverse translation process described above is performed. The control unit 20 transmits the read data stored in the RAM 30 to the host 1 (Step S930).

In a case where the decoding process is different between a case where the error mitigating code process is performed based on the first selection rule and a case where the error mitigating code process is performed based on the second selection rule, at the time of performing the decoding process, by comparing the trigger parameter with the threshold, for the reading target page, it may be determined whether the coding process based on the first selection rule is performed or the coding process based on the second selection rule is performed.

Figure 28:
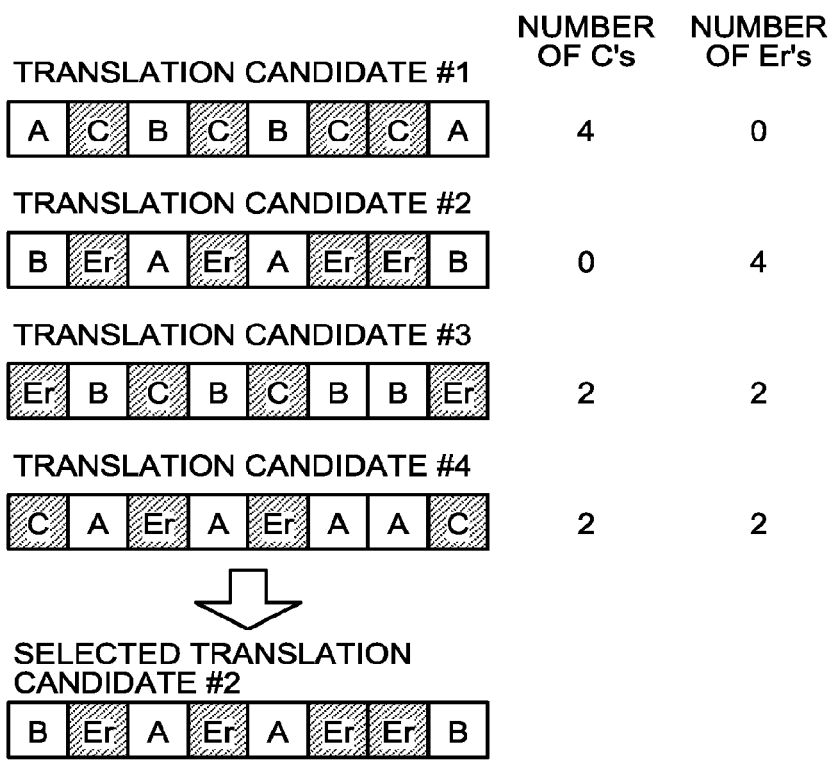
FIG. 28 illustrates four translation candidates acquired by an error mitigating code process and one translation candidate selected according to a first selection rule applied to an early stage.

FIG. 28 illustrates four translation candidates #1 to #4 acquired by an error mitigating code process and one translation candidate #2 selected based on the first selection rule applied to the early stage. Each square corresponds to one memory cell, and "A", "B", "C", and "Er" written inside squares correspond to four threshold voltage distributions illustrated in FIG. 5. The translation candidate #1 has four distributions of C and no distribution of Er. The translation candidate #2 has no distribution of C and four distributions of Er. The translation candidate #3 has two distributions of C and two distributions of Er. The translation candidate #4 has two distributions of C and two distributions of Er. According to the first selection rule, a translation candidate having a large number of distributions of Er having a lowest threshold voltage and having a small number of distributions of C having a highest threshold voltage is selected. Accordingly, in this case, the translation candidate #2 is selected.

FIG. 29 illustrates four translation candidates #1 to #4 acquired by an error mitigating code process and one translation candidate #3 selected based on the second selection rule applied to the late stage. The translation candidate #1 has one pattern of C-Er-C. The translation candidate #2 has one pattern of Er-C-Er. Each of the translation candidates #3 and #4 does not have a pattern of C-Er-C nor a pattern of Er-C-Er. The translation candidate #3 has no distribution of C and three distributions of Er. The translation candidate #4 has three distributions of C and no distribution of Er. The translation candidates #3 and #4 have the same condition for the occurrence of the pattern of C-Er-C or the pattern of Er-C-Er. However, since the translation candidate #3 has more distributions of Er than the translation candidate #4 and has less distributions of C than the translation candidate #4, in this case, the translation candidate #3 is selected.

In this way, according to the seventh embodiment, the first selection rule for improving the endurance of a memory cell is applied to the early stage, and the second selection rule for decreasing the Er to A error is applied to the late stage. Therefore, according to the seventh embodiment, the read error is decreased, and the life time of the NAND 10 can be lengthened.

In the description presented above, while the selection rule switching process from the first selection rule to the second selection rule, which is performed by the rule switching unit 56, is applied only to the error mitigating code process, the switching process described above may be applied only to the padding process. In other words, the seventh embodiment may be applied to the first to third embodiments. Furthermore, the switching process described above may be applied to both the padding process and the error mitigating code process. In other words, the seventh embodiment may be applied to the fourth to sixth embodiments.

FIG. 30 is a diagram that illustrates a modified example of the data processing unit 50 applied to the seventh embodiment. The data processing unit 50 includes: a first error mitigating code unit 55a; a second error mitigating code unit 55b; a switching unit 57; a selector 58; and a selector 59. The first error mitigating code unit 55a performs the error mitigating code process described above based on the first selection rule. The second error mitigating code unit 55b performs the error mitigating code process described above based on the second selection rule. The switching unit 57, at the time of coding and decoding, determines switching timing from the early stage to the late stage based on the trigger parameter input from the control unit 20. In a case where the early stage is determined, the switching unit 57 sets the selectors 58 and 59 such that the first error mitigating code unit 55a is selected. On the other hand, in a case where the late stage is determined, the switching unit 57 sets the selectors 58 and 59 such that the second error mitigating code unit 55b is selected.

(Eighth Embodiment)

Figure 31:
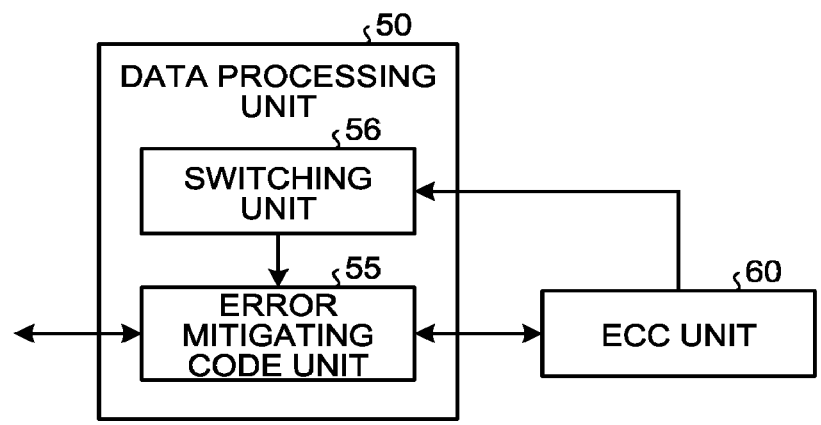
FIG. 31 is a block diagram that illustrates an example of the internal configuration of a data processing unit applied to an eighth embodiment.

FIG. 31 is a diagram that illustrates an example of the internal configuration of a data processing unit 50 applied to an eighth embodiment. In this eighth embodiment, the rule switching unit 56 determines switching timing from the early stage to the late stage based on a parameter used for determining the degree of wear of a NAND 10 that is input from an ECC unit 60.

As trigger parameters input from the ECC unit to the rule switching unit 56 for determining the degree of wear, for example, a bit error rate, the number of frames performed soft-bit decoding, and the number of iterations of iterative decoding are employed.

The bit error rate is a value acquired by dividing the number of bits failing in the decoding process by the number of bits of read data at the time of a decoding process of read data performed by the ECC unit 60. For example, when read data of each page of the NAND 10 is decoded, the ECC unit 60 calculates a bit error rate (BER) and inputs an average value of the BER during a certain period to the rule switching unit 56. Alternatively, the ECC unit 60 acquires BERs of a plurality of specific pages selected in advance as sample targets and inputs an average value of the BERs acquired during the certain period to the rule switching unit 56.

The number of frames of soft-bit decoding is the number of frames for which soft-bit decoding is performed from among all the frames configuring a product code at the time of a decoding process of read data that is performed by the ECC unit 60. At the time of reading, a process as below is performed. First, hard-bit decoding is performed. The hard-bit decoding includes applying a default reference read voltage to a memory cell s of a read area, determining whether data stored in the memory cell s is "1" or "0", and outputting a result of the determination as a hard decision value. The ECC unit 60 decodes all the frames configuring the product code based on such hard decision values. In a case where the decoding of all the frames is successful, the decoding process ends. On the other hand, in a case where there is a frame failing in the decoding process among all the frames, soft-bit decoding is performed. In the soft-bit decoding, reading using a plurality of read voltages arranged on both sides of the reference read voltage in addition to the default reference read voltage is performed. Then, in the soft-bit decoding, for each memory cell, a process of outputting information representing one of areas interposed between the plurality of read voltages to which a threshold voltage belongs as a soft decision value is performed. Based on such a soft decision value, a decoding process for the frame that has failed in the decoding described above is performed. The number of frames of the soft-bit decoding can be differently stated as the number of frames failing in the hard-bit decoding among all the frames configuring the product code. The ECC unit 60, for example, inputs an average value of the numbers of frames of the soft-bit decoding during a certain period to the rule switching unit 56.

The number of iterations of iterative decoding is the number of iterations of the process of repeatedly performing decoding of the code words of a first dimension of the product code and decoding of the code words of a second dimension of the product code. In a case where a product code is decoded, code words of the first dimension configuring the product code are sequentially decoded. In a case where there is a code word not successful in the decoding among the code words of the first dimension configuring the product code, an error that is correctable in the decoding of the code words of the first dimension is corrected, and code words of the second dimension are decoded. In a case where there is a code word not successful in the decoding by performing the decoding of the code words of the second dimension, an error that is correctable in the decoding of the code words of the second dimension is corrected, and the code words of the first dimension are decoded again. As above, a process of iteratively performing decoding of the code words of the first dimension and the decoding of the code words of the second dimension until an ending condition is satisfied, in other words, iterative decoding is performed. The ECC unit 60, for example, inputs an average value of the number of iteration of iterative decoding during a certain period to the rule switching unit 56.

A process performed at the time of coding in the eighth embodiment is different from that of the seventh embodiment in that the trigger parameter is input from the ECC unit 60 to the rule switching unit 56 and is the same as that of the seventh embodiment in the other points, and duplicate description will not be presented. In addition, a process performed at the time of decoding in the eighth embodiment is the same as that of the seventh embodiment, and thus, duplicate description will not be presented.

In addition, the eighth embodiment may be applied to the first to third embodiments. Furthermore, the eighth embodiment may be applied to the fourth to sixth embodiments.

Figure 32:
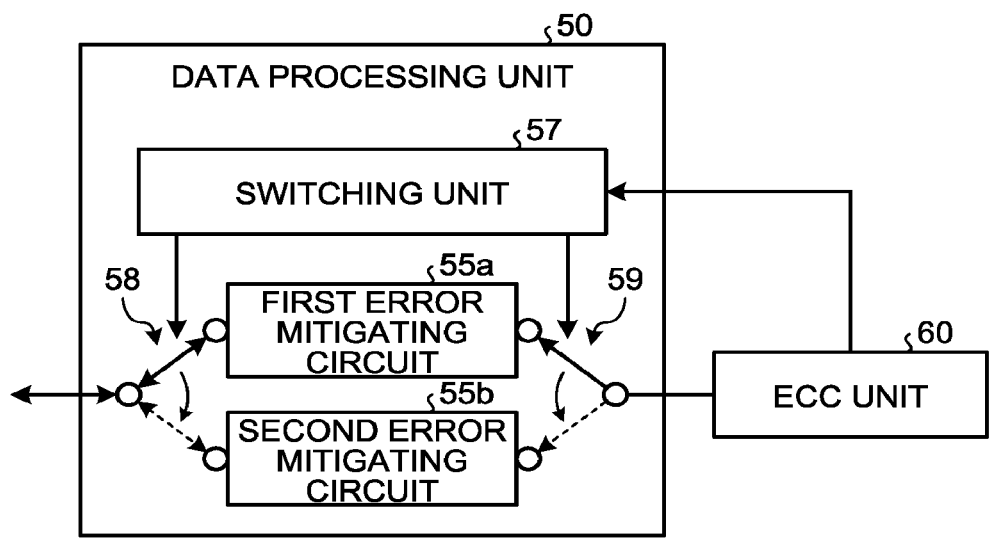
FIG. 32 is a block diagram that illustrates another example of the internal configuration of a data processing unit applied to the eighth embodiment.

FIG. 32 is a diagram that illustrates a modified example of the data processing unit 50 applied to the eight embodiment. The data processing unit 50 includes: a first error mitigating code unit 55a; a second error mitigating code unit 55b; a switching unit 57; a selector 58; and a selector 59. The first error mitigating code unit 55a performs the error mitigating code process described above based on the first selection rule. The second error mitigating code unit 55b performs the error mitigating code process described above based on the second selection rule. The switching unit 57, at the time of coding and decoding, determines switching timing from the early stage to the late stage based on the trigger parameter input from the ECC unit 60. In a case where the early stage is determined, the switching unit 57 sets the selectors 58 and 59 such that the first error mitigating code unit 55a is selected. On the other hand, in a case where the late stage is determined, the switching unit 57 sets the selectors 58 and 59 such that the second error mitigating code unit 55b is selected.

Next, a process at the time of decoding performed by the data processing unit 50 illustrated in FIG. 32 will be described with reference to a flowchart illustrated in FIG. 33. The control unit 20 reads a code word from a reading target page of the NAND 10 (Step S1000). The ECC unit 60 decodes the read code word (Step S1010). The switching unit 57 of the data processing unit 50 acquires a trigger parameter from the ECC unit (Step S1020) and compares the acquired the trigger parameter with a threshold (Step S1030). In a case where the trigger parameter is within the threshold (Step S1030: No), the switching unit 57 sets the selectors 58 and 59 such that the first error mitigating code unit 55a is selected (Step S1040). The first error mitigating code unit 55a performs the error mitigating code process described above based on the first selection rule. On the other hand, in a case where the trigger parameter is larger than the threshold (Step S1030: Yes), the switching unit 57 switches the selectors 58 and 59 such that the second error mitigating code unit 55b is selected (Step S1050). The second error mitigating code unit 55b performs the error mitigating code process described above based on the second selection rule. The control unit 20 transmits read data to the host 1 (Step S1060).

In the seventh or eighth embodiment, the error mitigating code unit 55 generates a plurality of translation candidates, and selects one translation candidate from the plurality of generated translation candidates based on the first or second selection rule. However, the error mitigating code unit 55 may be configured to write, into NAND 10, first processed data acquired by a first process during a first period, and write, into NAND 10, second processed data acquired by a second process during a second period. The first process includes translating write data to the first processed data based on a number of first value or a number of second value. The first value corresponds to a highest threshold voltage distribution. The second value corresponds to a lowest threshold voltage distribution. The second period is a period after the first period. The second process includes translating the write data to the second processed data based on an arrangement of the first value and second value.

While four-value threshold voltage distributions have been illustrated in the first to eight embodiments described above, the first to eighth embodiments described above may be applied also to a memory having threshold voltage distributions of two values, eight values, 16 values, or more values. In addition, for data coding of a multi-value memory cell, while one kind of data coding relating to four values has been illustrated, the first to eighth embodiments described above may be applied to any other arbitrary data coding.

In the description presented above, while the translation information TI is written into the NAND 10 with being added to data, the translation information TI may be managed in association with a logical address or a physical address as management information.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A memory system comprising:
  a nonvolatile memory including a plurality of physical sectors, each of the physical sectors including a plurality of memory cells, each of the memory cells being capable of storing data of N bits using threshold voltage distributions of the N-th power of two, each of the physical sectors storing data of N pages, N being a natural number of one or more; and a controller configured to:
write, into a first physical sector, first processed data acquired by a first process during a first period, the first process including translating first data to the first processed data based on a number of first value or a number of second value, the first value corresponding to a highest threshold voltage distribution among threshold voltage distributions of the N-th power of two, the second value corresponding to a lowest threshold voltage distribution among threshold voltage distributions of the N-th power of two; and
write, into the first physical sector, second processed data acquired by a second process during a second period, the second period being a period after the first period, the second process including translating the first data to the second processed data based on an arrangement of the first value and second value.

2. The memory system according to claim 1, wherein
the first data is write data to be written into the N pages,
the first process includes
generating a plurality of data translation candidates by performing a first data translation for the first data,
selecting one data translation candidate from among the plurality of generated data translation candidates based on a first selection rule, and
writing the selected data translation candidate into the first physical sector, the first selection rule including selecting the data translation candidate having a smallest number of the first values or selecting the data translation candidate having a largest number of the second values, and
the second process includes
generating a plurality of data translation candidates by performing the first data translation for the first data,
selecting one data translation candidate from among the plurality of generated data translation candidates based on a second selection rule, and
writing the selected data translation candidate into the first physical sector, the second selection rule including selecting the data translation candidate having a smallest number of pairs, the pairs being made up of the first value and the second value that are adjacent to each other.

3. The memory system according to claim 2, wherein the controller performs an inverse translation for data read from the nonvolatile memory based on translation information, the translation information representing a content of a data translation performed for the selected data translation candidate, the inverse translation being an inverse translation of the data translation performed for the selected data translation candidate.

4. The memory system according to claim 1, wherein the controller performs the first process when a degree of wear of the nonvolatile memory is less than a first threshold and performs the second process when the degree of wear is more than the first threshold.

5. The memory system according to claim 1, wherein the first data translation includes a logical operation of the write data and a first bit pattern.

6. The memory system according to claim 2, wherein the first data translation includes adding padding data having a different padding position and different pad data for each certain unit of the first data.

7. The memory system according to claim 2, wherein the controller performs the first data translation for each data of a first management unit, the first management unit having a certain data length acquired by dividing data of one page into a plurality of parts.

8. A memory system comprising:
a nonvolatile memory including a plurality of physical sectors, each of the physical sectors including a plurality of memory cells, each of the memory cells being capable of storing data of N bits using threshold voltage distributions of the N-th power of two, each of the physical sectors storing data of N pages, N being a natural number of one or more; and
a controller configured to:
generate a plurality of data translation candidates by performing a first data translation for write data to be written into the N pages, the first data translation including performing of a plurality of padding processes that include adding, to the write data, padding data, each of the padding data padded by the plurality of padding processes having a different padding position and different pad data;
select one data translation candidate from among the plurality of generated data translation candidates based on a first selection rule; and
write, into a first physical sector, the selected data translation candidate and padding position information, the padding position information representing an adding position of padding data for each of the pages.

9. The memory system according to claim 8, wherein the controller is configured to perform an inverse translation of the first data translation for data read from the nonvolatile memory based on the padding position information included in the read data, the first inverse translation including removing of the padding data and the padding position information from the read data.

10. The memory system according to claim 8, wherein the first data translation includes generating a plurality of data translation candidates configured by all the combinations having different padding positions and different pad data.

11. The memory system according to claim 8, wherein the first data translation includes generating a plurality of data translation candidates configured by some of all the combinations having different padding positions and different pad data.

12. The memory system according to claim 8, wherein the controller is configured to:
generate a plurality of first data translation candidates configured by some of all the combinations having different padding positions and different pad data at the time of the first data translation;
select one first data translation candidate from among the plurality of generated first data translation candidates based on the first selection rule;
correct data of the selected first data translation candidate based on the first selection rule; and
write, into the first physical sector, data of each of the pages included in the first data translation candidate after the correction and the padding position information.

13. The memory system according to claim 8, wherein the controller performs the first data translation for each data of a first management unit and adds the padding position information in correspondence with the data of the first management unit, the first management unit having a certain data length acquired by dividing data of one page into a plurality of parts.

14. A memory system comprising:
a nonvolatile memory including a plurality of physical sectors, each of the physical sectors including a plurality of memory cells, each of the memory cells being capable of storing data of N bits using threshold voltage distributions of the N-th power of two, each of the physical sectors storing data of N pages, N being a natural number of one or more; and
a controller configured to:
generate a plurality of data translation candidates by performing a first data translation and a second data translation based on write data to be written into the N pages, the first data translation including performing of a plurality of padding processes that include adding padding data, each of the padding data padded by the plurality of padding processes having a different padding position and different pad data to the write data, the second data translation including a logical operation of the write data and a first bit pattern;
select one data translation candidate from among the plurality of generated data translation candidates based on a first selection rule; and
write, into a first physical sector, the selected data translation candidate and translation information representing a translation content of data for each of the pages.

15. The memory system according to claim 14, wherein the controller is configured to perform an inverse translation of the first and second data translations for data read from the nonvolatile memory based on the translation information included in the read data, the inverse translation including removing of the padding data and the translation information from the read data by performing an inverse translation of the logical operation performed for the selected data translation candidate.

16. The memory system according to claim 14, wherein the logical operation is flipping the write data or an exclusive OR operation of the write data and the first bit pattern.

17. The memory system according to claim 14,
wherein the first data translation includes generating a plurality of first data translation candidates configured by all the combinations having different padding positions and different pad data,
wherein the second data translation includes generating a plurality of second data translation candidates including all the combinations configured based on whether or not the logical operation is performed for each data corresponding to each page of the N pages for each of the plurality of first data translation candidates, and
wherein the controller:
selects one second data translation candidate from among the plurality of generated second data translation candidates based on a first selection rule; and
writes the selected second data translation candidate and the translation information into the first physical sector.

18. The memory system according to claim 14,
wherein the first data translation includes generating a plurality of first data translation candidates configured by some of all the combinations having different padding positions and different pad data,
wherein the second data translation includes generating a plurality of second data translation candidates including a plurality of combinations configured based on whether or not the logical operation is performed for each data corresponding to each page of the N pages for each of the plurality of first data translation candidates, and
wherein the controller:
selects one second data translation candidate from among the plurality of generated second data translation candidates based on a first selection rule; and
writes the selected second data translation candidate and the translation information into the first physical sector.

19. The memory system according to claim 14,
wherein the first data translation includes generating a plurality of first data translation candidates configured by some of all the combinations having different padding positions and different pad data,
wherein the second data translation includes generating a plurality of second data translation candidates including a plurality of combinations configured based on whether or not the logical operation is performed for each data corresponding to each page of the N pages for each of the plurality of first data translation candidates, and
wherein the controller:
selects one second data translation candidate from among the plurality of generated second data translation candidates based on a first selection rule;
corrects data of the selected second data translation candidate based on the first selection rule; and
writes the second data translation candidate after the correction and the translation information into the first physical sector.

20. The memory system according to claim 14, wherein the controller performs the first data translation for each data of a first management unit and adds the translation information in correspondence with the data of the first management unit, the first management unit having a certain data length acquired by dividing data of one page into a plurality of parts.

* * * * *